US010692969B1

(12) United States Patent
Lin et al.

(10) Patent No.: US 10,692,969 B1
(45) Date of Patent: Jun. 23, 2020

(54) SEMICONDUCTOR STRUCTURES

(71) Applicant: Vanguard International Semiconductor Corporation, Hsinchu (TW)

(72) Inventors: Ting-You Lin, Hsinchu (TW); Chi-Li Tu, Hsinchu County (TW); Shu-Wei Hsu, Hsinchu (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/359,505

(22) Filed: Mar. 20, 2019

(51) Int. Cl.
*H01L 23/58* (2006.01)
*H01L 23/62* (2006.01)
*H01L 29/06* (2006.01)
*H01L 29/78* (2006.01)
*H01L 29/10* (2006.01)
*H01L 27/088* (2006.01)

(52) U.S. Cl.
CPC ........ *H01L 29/0607* (2013.01); *H01L 27/088* (2013.01); *H01L 29/0684* (2013.01); *H01L 29/1095* (2013.01); *H01L 29/7823* (2013.01); *H01L 29/7831* (2013.01); *H01L 29/7841* (2013.01)

(58) Field of Classification Search
CPC ............. H01L 29/7831; H01L 27/0886; H01L 27/088; H01L 29/1095; H01L 29/0696; H01L 29/7811; H01L 29/086; H01L 29/772; H01L 29/781; H01L 29/7813; H01L 29/7841; H01L 29/7926
USPC ....................................................... 257/365
See application file for complete search history.

(56) References Cited

U.S. PATENT DOCUMENTS

2004/0016992 A1* 1/2004 Mallikarjunaswamy .................... H01L 27/0262 257/546
2006/0208340 A1* 9/2006 Glenn ................. H01L 27/0255 257/603

FOREIGN PATENT DOCUMENTS

CN 104538446 A 4/2015
CN 104701380 A 6/2015

OTHER PUBLICATIONS

Taiwanese Office Action and Search Report, dated Nov. 29, 2019, for Taiwanese Application No. 108100006.

* cited by examiner

*Primary Examiner* — Theresa T Doan
(74) *Attorney, Agent, or Firm* — Birch, Stewart, Kolasch & Birch, LLP

(57) ABSTRACT

A semiconductor structure includes a semiconductor substrate, a buried layer, a pair of first well regions, a second well region, a body doped region, and a first heavily doped region. The semiconductor substrate has a first conductivity type. The buried layer is disposed on the semiconductor substrate. The first well regions having the second conductivity type are disposed on the buried layer. The second well region having the first conductivity type is disposed between the first well regions. The body doped region having the first conductivity type is disposed in the second well region. The first heavily doped region having the first conductivity type is disposed in the body doped region. From a top view, the first heavily doped region and the first well regions extend in a first direction, and the first heavily doped region extends beyond the opposite edges of the first well regions.

24 Claims, 14 Drawing Sheets

SEMICONDUCTOR STRUCTURES

BACKGROUND

Technical Field

The disclosure relates to a semiconductor structure, and more particularly to a bidirectional current semiconductor structure.

Description of the Related Art

A battery disconnect switch (also known as a bidirectional power switch) is a bidirectional switch that is used for enabling or disabling a current flow between a battery and a load or a battery and a battery charger. While a conventional power metal-oxide-semiconductor field-effect Transistor (power MOSFET) may be used to form a battery disconnect switch, the presence of a single P-N junction diode between the drain and the source makes a single power MOSFET incapable of bidirectional current blocking.

Nowadays, since bidirectional current blocking between two or more power sources is a necessary function of all battery disconnect switches, the use of discrete power MOSFETs requires that two devices be placed back-to-back in series, with either a common source or a common drain. The total on-resistance of the battery disconnect switch is then twice that of an individual power MOSFET, and other problems may arise, such as excessive current density, current leakage, or uneven conduction.

SUMMARY

In one embodiment of the present disclosure, a semiconductor structure is provided, wherein the semiconductor structure includes a semiconductor substrate, a buried layer, a pair of first well regions, a second well region, a body doped region, and a first heavily doped region. The semiconductor substrate has a first conductivity type. The buried layer is disposed on the semiconductor substrate and has a second conductivity type that is the opposite of the first conductivity type. The pair of first well regions are disposed on the buried layer and have the second conductivity type. The second well region is disposed on the buried layer and between the pair of first well regions and has the first conductivity type and a first dopant concentration. The body doped region is disposed in the second well region and has the first conductivity type and a second dopant concentration. The first heavily doped region is disposed in the body doped region and has the first conductivity type and a third dopant concentration. The third dopant concentration is greater than the second dopant concentration, and the second dopant concentration is greater than the first dopant concentration. From a top view, the first heavily doped region and the pair of first well regions extend in a first direction, and the first heavily doped region extends beyond the opposite edges of the pair of first well regions.

In one embodiment of the present disclosure, a semiconductor structure is provided, wherein the semiconductor structure includes a semiconductor substrate, a buried layer, a pair of first well regions, a pair of second well regions, a pair of body doped regions, a pair of first heavily doped regions, and a third well region. The semiconductor substrate has a first conductivity type. The buried layer is disposed on the semiconductor substrate and has a second conductivity type that is the opposite of the first conductivity type. The pair of first well regions are disposed on the buried layer and have the second conductivity type. The pair of second well regions are disposed on the buried layer and between the pair of first well regions and have the first conductivity type and a first dopant concentration. The pair of body doped regions are disposed in the pair of second well regions respectively and have the first conductivity type and a second dopant concentration. The pair of first heavily doped regions are disposed in the pair of body doped regions respectively and have the first conductivity type and a third dopant concentration. The third dopant concentration is greater than the second dopant concentration, and the second dopant concentration is greater than the first dopant concentration. The third well region is disposed on the buried layer and between the pair of second well regions and has the second conductivity type. From a top view, the pair of first heavily doped regions and the pair of first well regions extend in a first direction, and the pair of first heavily doped regions extends beyond the opposite edges of the pair of first well regions.

BRIEF DESCRIPTION OF THE DRAWINGS

Aspects of this disclosure are best understood from the following detailed description when read with the accompanying figures. It should be noted that, in accordance with common practice in the industry, various features are not drawn to scale. In fact, the dimensions of the various features may be arbitrarily increased or reduced for clarity of discussion.

DETAILED DESCRIPTION

Figure 1:
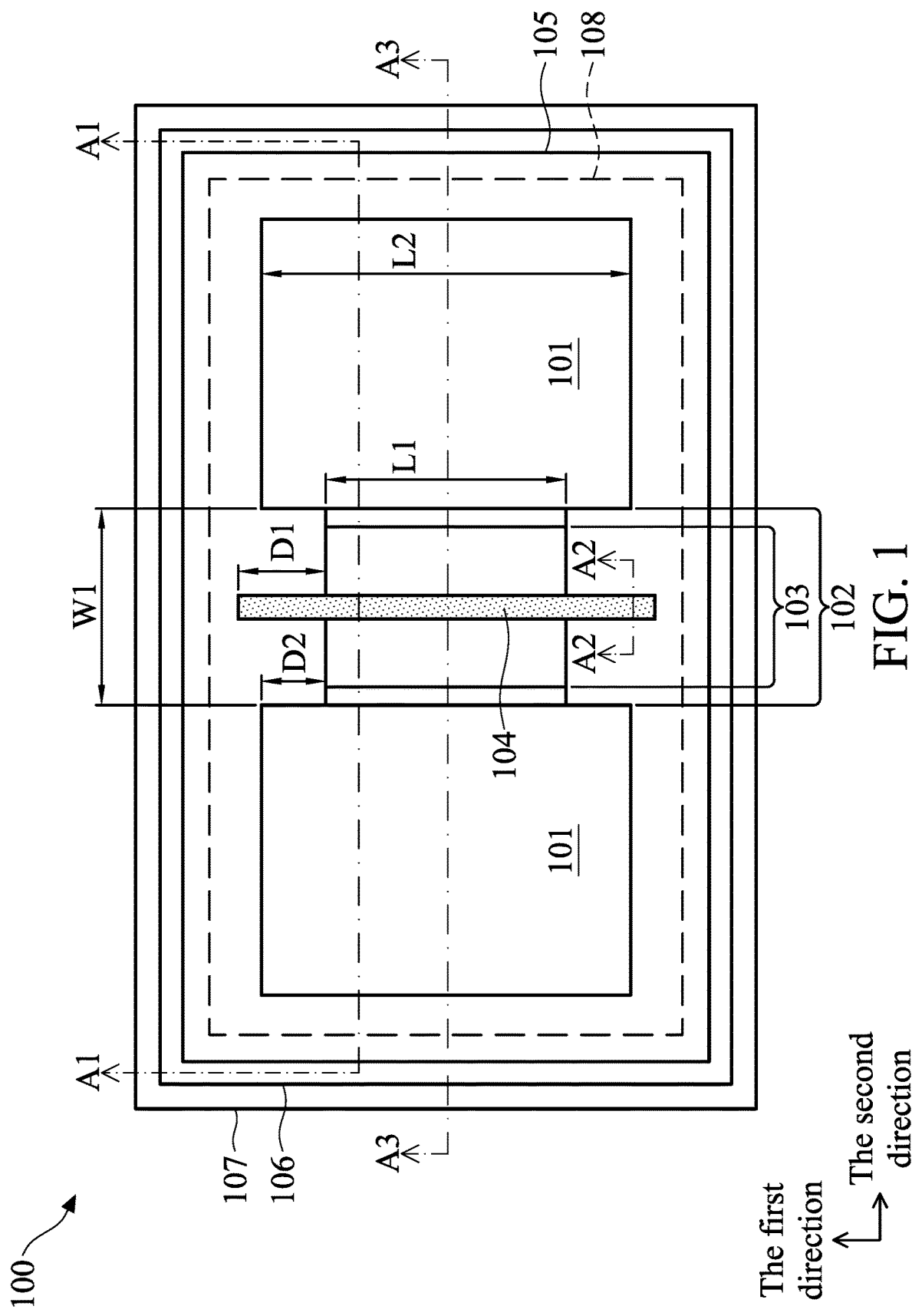
FIG. 1 is a top-view diagram illustrating a portion of an exemplary semiconductor structure, according to some embodiments of the present disclosure.

The following disclosure provides many different embodiments, or examples, for implementing different features of the subject matter provided. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "over", "below," "lower," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented and the spatially relative descriptors used herein may likewise be interpreted accordingly.

The terms "about", "approximately", and "substantially" used herein generally refer to the value of an error or a range within 20 percent, preferably within 10 percent, and more preferably within 5 percent, within 3 percent, within 2 percent, within 1 percent, or within 0.5 percent. If there is no specific description, the values mentioned are to be regarded as an approximation that is an error or range expressed as "about", "approximate", or "substantially".

Although some embodiments are discussed with operations performed in a particular order, these operations may be performed in another logical order. Additional features can be provided to the semiconductor structures in embodiments of the present disclosure. Some of the features described below can be replaced or eliminated for different embodiments.

The present disclosure provides embodiments of a semiconductor structure which includes a novel floating body dual gate (FBDG) MOSFET. According to some embodiments of the present disclosure, the semiconductor structure including a FBDG MOSFET may be applied to a lithium ion battery disconnect switch or other similar battery disconnect switches. It should be noted that the applications of the embodiments of the present disclosure are not limited thereto. The semiconductor structure provided in the embodiments of the present disclosure includes a doped region disposed between a plurality of well regions and extending along a specific direction. With the disclosed layout of the doped region, the current uniformity in a transistor can be enhanced, the current leakage between well regions can be reduced, and the on-resistance and the area of active region can also be reduced.

Figure 2:
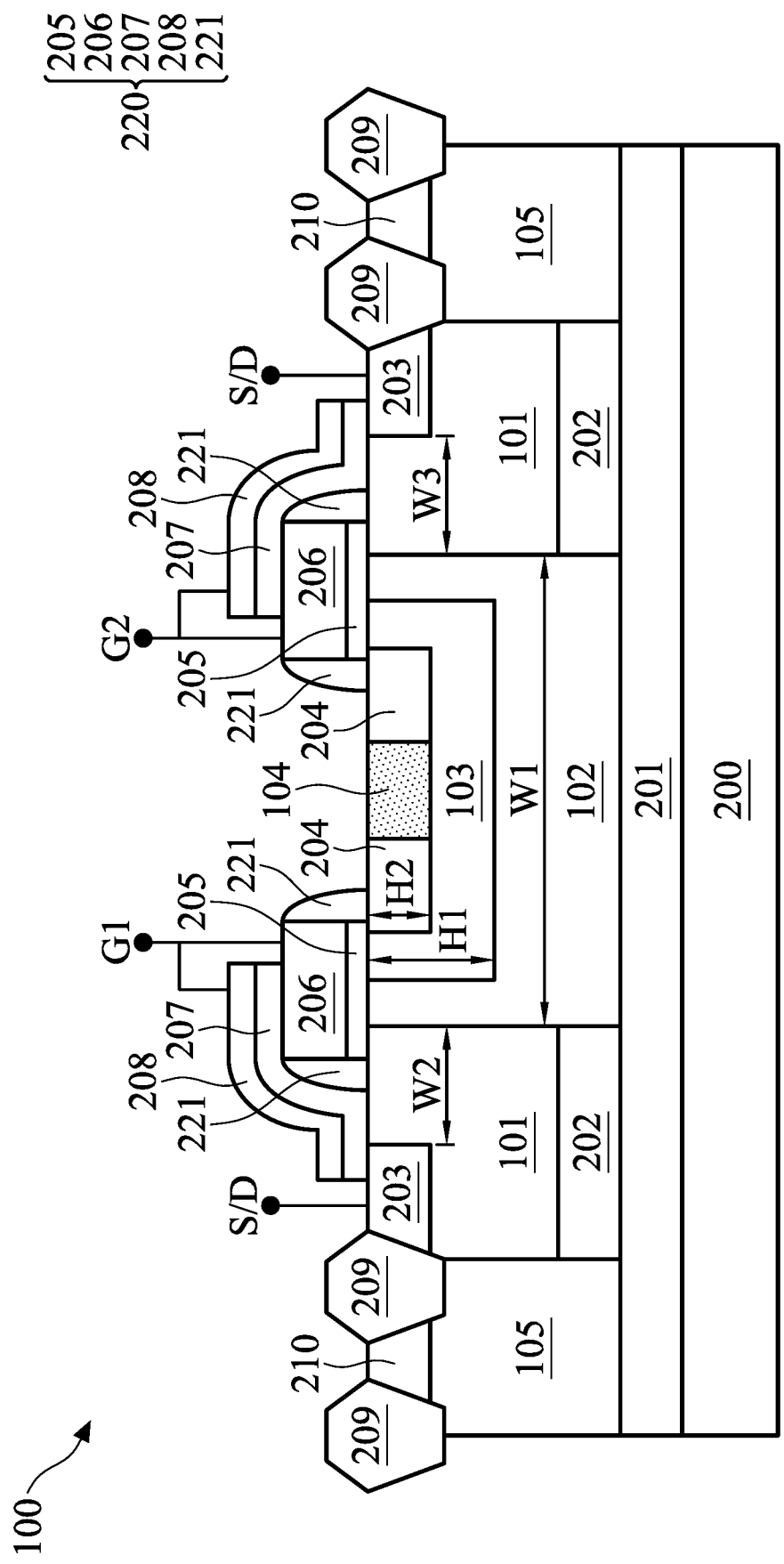
FIG. 2 is a cross-sectional diagram illustrating a semiconductor structure along the line segment A1-A1 in FIG. 1, according to some embodiments of the present disclosure.
Figure 3:
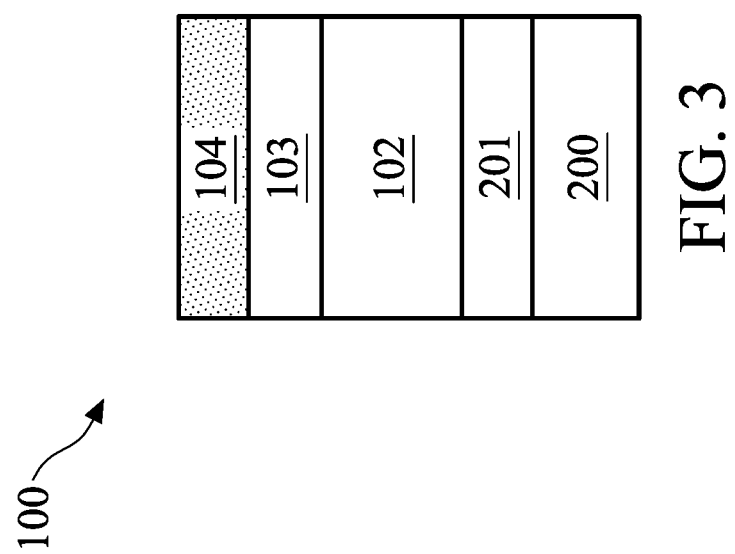
FIG. 3 is a cross-sectional diagram illustrating a semiconductor structure along the line segment A2-A2 in FIG. 1, according to some embodiments of the present disclosure.
Figure 4:
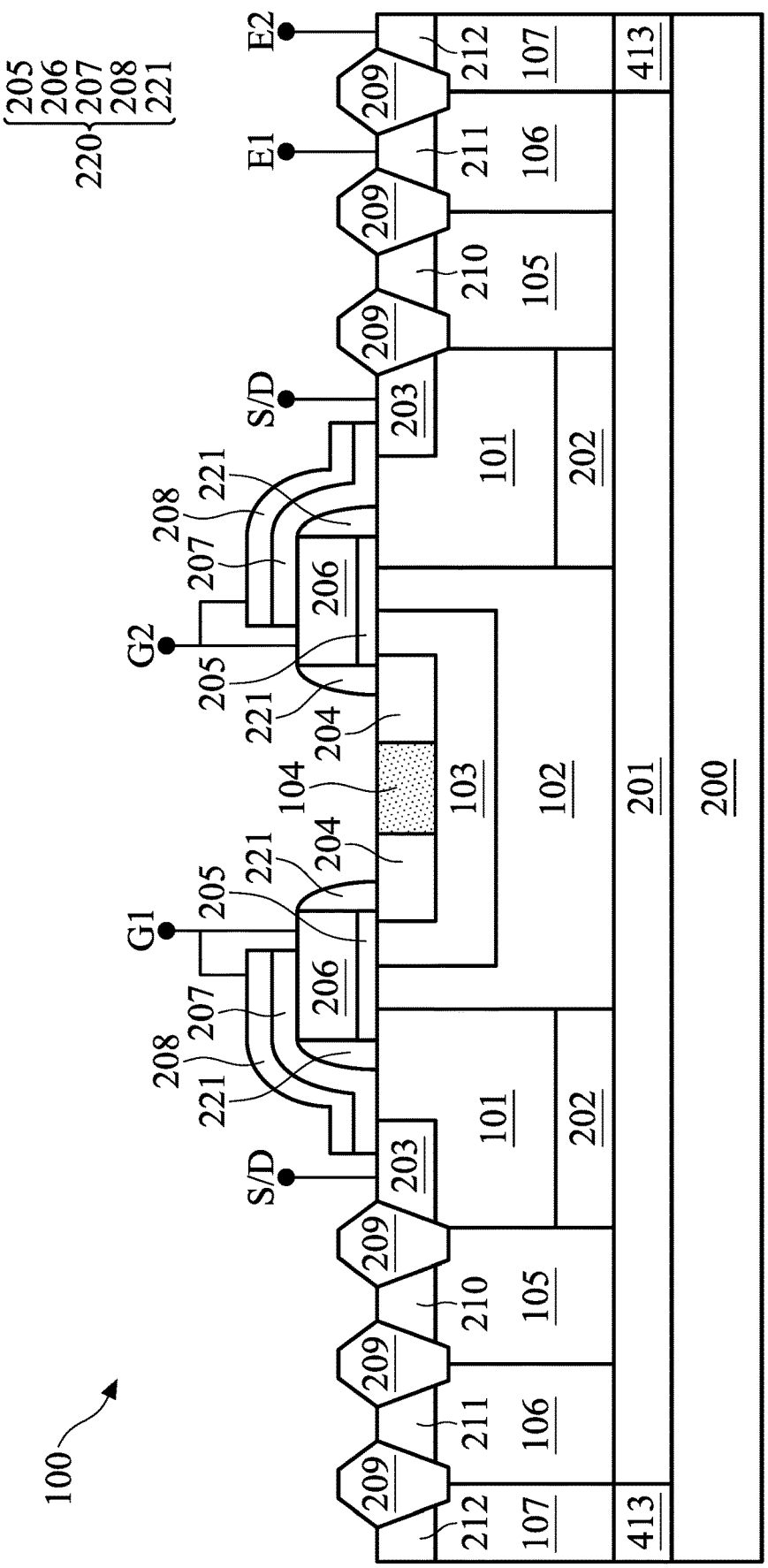
FIG. 4 is a cross-sectional diagram illustrating a semiconductor structure along the line segment A3-A3 in FIG. 1, according to some embodiments of the present disclosure.

First, please refer to FIG. 1 along with FIGS. 2-4. FIG. 1 is a top-view diagram illustrating a portion of an exemplary semiconductor structure 100. FIG. 2 is a cross-sectional diagram illustrating a semiconductor structure 100 along the line segment A1-A1 in FIG. 1. FIG. 3 is a cross-sectional diagram illustrating a semiconductor structure 100 along the line segment A2-A2 in FIG. 1. FIG. 4 is a cross-sectional diagram illustrating a semiconductor structure 100 along the line segment A3-A3 in FIG. 1. It should be noted that FIGS. 1-4 do not illustrate all of the elements of a semiconductor 100 for the purpose of simplicity and clarity.

As shown in FIG. 1, a top-view diagram of a portion of an exemplary semiconductor structure is illustrated, according to some embodiments of the present disclosure. According to some embodiments of the present disclosure, the semiconductor structure 100 includes a pair of first well regions 101, a second well region 102 disposed between the pair of first well regions 101, and a body doped region 103 and a first heavily doped region 104 disposed in the second well region 102, wherein an end of the first heavily doped region 104 is I-shaped from a top view.

From a top view, according to some embodiments of the present disclosure, the first heavily doped region 104 and the pair of first well regions 101 both extend in the first direction, wherein the first heavily doped region 104 extends in the first direction and beyond the opposite edges of the pair of first well regions 101. In some embodiments, the second well region 102 has a first length L1 extending in the first direction, and the pair of first well regions 101 have a second length L2 extending in the second direction, wherein the first length L1 is shorter than or the same as the second length L2. In some embodiments where the voltage difference between the pair of first well regions 101 is greater than 0 volt (V), the surface leakage path may arise to negatively affect the circuit operation while the first length L1 is shorter than the second length L2 and a width W is less than 2 micrometers (um).

From a top view, according to some embodiments of the present disclosure, the first heavily doped region 104 extends in the first direction and beyond a first edge of the second well region 102 with a first distance D1, and the pair of first well regions 101 extend in the first direction and beyond the first edge of the second well region 102 with a second distance D2. For example, the first distance D1 may be in a range from about 1 um to about 10 um, such as 3 um. The second distance D2 may be in a range from about 1 um to about 10 um, such as 2 um. The difference between the first distance D1 and the second distance D2 (i.e. D1 minus D2) may be in a range from about 0 um to about 10 um, such as 1 um. In some embodiments, the performance of controlling the surface current can be realized while the difference between the first distance D1 and the second distance D2 is greater than 0 um. In other embodiments, the surface leakage path may arise to negatively affect the circuit operation while the difference between the first distance D1 and the second distance D2 is less than 0 um.

According to some embodiments of the present disclosure, the semiconductor structure 100 includes the body doped region 103 and the first heavily doped region 104 disposed between the pair of first well regions 101. With the protective structure formed of the layout of the body doped region 103 and the first heavily doped region 104, the current leakage between the pair of first well regions 101 can be reduced or prevented. In some embodiments, the disclosed layout of the body doped region 103 and the first heavily doped region 104 can be used to prevent from the current leakage while the distance between the pair of first well regions 101(e.g. the width W1 in FIG. 1) is less than 2 um. It should be noted that in order to succinctly describe the embodiments of the present disclosure and highlight the technical features thereof, not all the elements of the semiconductor structure 100 are illustrated in FIG. 1, and not all of the elements in the cross-sectional diagram shown in FIGS. 2 and 4 are illustrated in FIG. 1.

As shown in FIG. 1, according to some embodiments of the present disclosure, in the semiconductor structure 100, the pair of first well regions 101 are surrounded by a third well region 105, the third well region 105 is surrounded by a fourth well region 106, and the fourth well region 106 is surrounded by a fifth well region 107. In some embodiments, the pair of first well regions 101 and the fourth well region 106 have the second conductivity type, and the second well region 102, the third well region 105, and the fifth well region 107 have the first conductivity type that is the opposite of the second conductivity type. In some embodiments, the first conductivity type is p-type, and the second conductivity type is n-type, but the present disclosure is not limited thereto.

As shown in FIG. 2 and referring to the top-view diagram shown in FIG. 1, according to some embodiments of the present disclosure, the semiconductor structure 100 mainly includes a semiconductor substrate 200 having the first conductivity type, a buried layer 201 disposed on the semiconductor substrate 200 having the second conductivity type, a pair of first well regions 101 disposed on the buried layer 201, a second well region 102 disposed on the buried layer 201 and between the pair of first well regions 101, a body doped region 103 disposed in the second well region 102, and a first heavily doped region 104 disposed in the body doped region 103. In some embodiments, the pair of first well regions 101 have the second conductivity type which is the same as the conductivity type of the buried layer 201, and the second well region 102, the body doped region 103, and the first heavily doped region 104 have the first conductivity type which is the same as the conductivity type of the semiconductor substrate 200. In some embodiments, the first conductivity type is p-type, and the second conductivity type that is the opposite of the first conductivity type is n-type. In some embodiments, the second well region 102 has a first dopant concentration, the body doped region 103 has a second dopant concentration, and the first heavily doped region 104 has a third dopant concentration, wherein the third dopant concentration is greater than the second dopant concentration, and the second dopant concentration is greater than the first dopant concentration.

As shown in FIG. 2, in some embodiments, the semiconductor substrate 200 may be a silicon substrate, but the embodiment of the present disclosure is not limited thereto. For example, the semiconductor substrate 200 may also be an elemental semiconductor including germanium, a compound semiconductor including gallium nitride, silicon carbide, gallium arsenide, gallium phosphide, indium phosphide, indium arsenide, and/or indium antimonide, an alloy semiconductor including SiGe, GaAsP, AlInAs, AlGaAs, GaInAs, GaInP, and/or GaInAsP, or a combination thereof. In some embodiments, the semiconductor substrate 200 may include a single crystal substrate, a multi-layer substrate, a gradient substrate, other suitable substrates, or combinations thereof. In some embodiments, the semiconductor substrate 200 has the first conductivity type, such as p-type, and the dopant of which may be such as B, Al, Ga, In, $BF^{3+}$ ions, or a combination thereof. The dopant concentration of the semiconductor substrate 200 is in a range from about $10^{15}/cm^3$ to about $10^{16}/cm^3$.

As shown in FIG. 2, according to some embodiments of the present disclosure, the semiconductor structure 100 includes the buried layer 201 on the semiconductor substrate 200. In some embodiments, the buried layer 201 has the second conductivity type, such as n-type, and the dopant of which may be such as P, As, N, Sb ions, or a combination thereof. The dopant concentration of the buried layer 201 is in a range from about $10^{17}/cm^3$ to about $10^{18}/cm^3$. In some embodiments, the thickness of the buried layer 201 may be about 6 um. In some embodiments, the buried layer 201 may be formed by an ion implantation process.

As shown in FIG. 2, according to some embodiments of the present disclosure, the semiconductor structure 100 includes the pair of first well regions 101 disposed on the buried layer 201. In some embodiments, the pair of first well regions 101 have the second conductivity type, such as n-type, and the dopant of which may be such as P, As, N, Sb ions, or a combination thereof. The dopant concentration of the pair of first well regions 101 is in a range from about $10^{15}/cm^3$ to about $10^{16}/cm^3$. In some embodiments, the pair of first well regions 101 may be formed by an ion implantation process or a diffusion process. In some embodiments, a first conductivity type region 202 is disposed between the first well region 101 and the buried layer 201. The first conductivity type region 202 may be formed by the same doping method and have the same dopant concentration as the semiconductor substrate 200. The details are not described again herein to avoid repetition. In other embodiments, the first well region 101 contacts the buried layer 201 directly.

As shown in FIG. 2, according to some embodiments of the present disclosure, the semiconductor structure 100 includes the second well region 102 disposed on the buried layer 201 and between the pair of first well regions 101. In some embodiments, the second well region 102 has the first conductivity type, such as p-type, and the dopant of which may be such as B, Al, Ga, In, $BF^{3+}$ ions, or a combination thereof. The dopant concentration of the second well region 102 is in a range from about $10^{15}/cm^3$ to about $10^{16}/cm^3$. In some embodiments, the second well region 102 may be formed by an ion implantation process or a diffusion process. From a top view, as shown in FIG. 1, in some embodiments, the width of the second well region 102 extending in the second direction is less than or equal to 2 um, such as 2 um or 1 um.

As shown in FIG. 2, according to some embodiments of the present disclosure, the semiconductor structure 100 includes the third well region 105 disposed on the buried layer 201, wherein the third well region 105 is disposed on the outside of the pair of first well regions 101 and surrounds the pair of first well regions 101 (as shown in FIG. 1). In some embodiments, the third well region 105 has the first conductivity type. The third well region 105 may be formed by the same doping method and have the same dopant concentration as the second well region 102. The details are not described again herein to avoid repetition. In some embodiments, a heavily doped region 210 having the same conductivity type as the third well region 105 may be formed near the upper surface of the semiconductor substrate 200. The heavily doped region 210 may electrically connect an electrode (not shown) through an interconnection structure (not shown).

In FIG. 2, according to some embodiments of the present disclosure, isolation structures 209 are formed between the first well regions 101 and the third well regions 105, and the isolation structures 209 are formed near the upper surface of the semiconductor substrate 200. In some embodiments, the isolation structures 209 may be made of silicon oxide, and the isolation structures 209 may be local oxidation of silicon (LOCOS) isolation structures 209 made by thermal oxidation process. In other embodiments, the isolation structures 209 may be shallow trench isolation (STI) structures made by an etching and deposition process.

As shown in FIG. 2, according to some embodiments of the present disclosure, the semiconductor structure 100 includes the body doped region 103 disposed in the second well region 102. In some embodiments, the body doped region 103 has the first conductivity type, such as p-type, and the dopant of which may be such as B, Al, Ga, In, $BF^{3+}$ ions, or a combination thereof. The dopant concentration of the body doped region 103 is in a range from about $10^{17}/cm^3$ to about $10^{18}/cm^3$. In some embodiments, the depth H1 of the body doped region 103 is in a range from about 0.5 um to about 1 um, such as 0.6 um. In some embodiments, the body doped region 103 may be formed by an ion implantation process or a diffusion process.

As shown in FIG. 2, according to some embodiments of the present disclosure, the semiconductor structure 100 includes the first heavily doped region 104 disposed in the body doped region 103. In some embodiments, the first heavily doped region 104 has the first conductivity type, such as p-type, and the dopant of which may be such as B, Al, Ga, In, $BF^{3+}$ ions, or a combination thereof. The dopant concentration of the first heavily doped region 104 is in a range from about $10^{18}/cm^3$ to about $10^{19}/cm^3$. In some embodiments, the depth H2 of the first heavily doped region 104 is less than about 0.5 um, such as 0.2 um. In some embodiments, the first heavily doped region 104 may be formed by an ion implantation process or a diffusion process.

Next, the layout of the body doped region 103 and the first heavily doped region 104 will be described in more detail with reference to FIG. 2 and FIG. 3. As shown in FIG. 3 illustrating a cross-sectional diagram along the line segment A2-A2 in FIG. 1, according to some embodiments of the present disclosure, the semiconductor structure 100 includes the semiconductor substrate 200, the buried layer 201, the body doped region 103, and the first heavily doped region 104 in the cross-sectional diagram. This shows that, in some embodiments, although merely a portion of the first heavily doped region 104 extending in the first direction and beyond the second well region 102 is illustrated in FIG. 1, the portion extending beyond the second well region 102 includes both the first heavily doped region 104 and the body doped region 103 under the first heavily doped region 104. The layout of the body doped region 103 and the first heavily doped region 104 provided in the embodiment of the present disclosure can serve as a protective structure to reduce the current leakage between the well regions effectively in case where the distance between the pair of first well regions is small (e.g. less than 2 um).

As shown in FIG. 2, according to some embodiments of the present disclosure, the semiconductor structure 100 further includes source/drain regions 203 disposed in the pair of first well regions 101 respectively, wherein the source/drain regions 203 are disposed near the upper surface of the semiconductor substrate 200. In some embodiments, the source/drain regions 203 have the second conductivity type, such as n-type. The source/drain regions 203 may electrically connect source/drain electrodes S/D through interconnection structures (not shown).

In some embodiments, the distance between the source region (drain region) 203 and the interface of the first well region 101 and the second well region 102 is a first drifting distance W2, and the distance between the drain region (source region) 203 and the interface of the first well region 101 and the second well region 102 is a second drifting distance W3. The first drifting distance W2 and the second drifting distance W3 are not greater than 2 um (i.e. less than or equal to 2 um). In some embodiments, the first drifting distance W2 and the second drifting distance W3 are the same, and thus the pair of first well regions 101 can be symmetric with respect to the first heavily doped region 104. In other embodiments, the first drifting distance W2 is different from the second drifting distance W3, and thus the pair of first well regions 101 can be asymmetric with respect to the first heavily doped region 104. In such cases, the pair of first well regions 101 have different drifting distances respectively (i.e. the pair of first well regions 101 have different areas respectively). Thus, the pair of first well regions 101 can bear different voltages respectively. For example, the maximal voltage that one of the first well regions 101 with a shorter drifting distance can bear is less than the maximal voltage that another one of the first well regions 101 with a longer drifting distance can bear. In other words, one of the first well regions 101 with a longer drifting distance can bear a greater voltage than another one of the first well regions 101 with a shorter drifting distance. In some embodiment of the present disclosure, according to the applied voltages, the area of the active region (e.g. an active region 108) of the semiconductor structure 100 can be reduced by adjusting the respective drifting distances of the pair of first well regions 101.

As shown in FIG. 2, according to some embodiments of the present disclosure, the semiconductor structure 100 further includes a pair of second heavily doped regions 204 disposed in the second well region 102, wherein the first heavily doped region 104 is disposed between the pair of second heavily doped regions 204. In some embodiments, the pair of second heavily doped regions 204 have the second conductivity type, such as n-type, and the dopant of which may be such as P, As, N, Sb ions, or a combination thereof. In some embodiments, the pair of second heavily doped regions 204 may be formed by an ion implantation process or a diffusion process. In some embodiments, the first heavily doped region 104 connects the pair of second heavily doped regions 204 through a surface conductor, and the first heavily doped region 104 and the pair of second heavily doped regions 204 can float. In such cases, the current can flow through the surface conductor without through an additional interconnection structure, so the goal of reducing the on-resistance and enhancing the current uniformity can be achieved. In other embodiments, the first heavily doped region 104 and the pair of second heavily doped regions 204 may electrically connect electrodes (not shown) through interconnection structures (not shown).

As shown in FIG. 2, according to some embodiments of the present disclosure, the semiconductor structure 100 further includes a pair of gate structures 220 disposed on the pair of first well regions 101 and the second well region 102, wherein the pair of gate structures 220 partially cover the pair of second heavily doped region 204. In some embodiments, each of the gate structures 220 includes a gate dielectric layer 205, a gate electrode layer 206 disposed on the gate dielectric layer 205, an insulating layer 207, a metal layer 208, and gate spacers 221. The gate spacers 221 are disposed on the opposite sides of the stack of the gate dielectric layer 205 and the gate electrode layer 206. The insulating layer 207 partially covers the first well region 101 and extends to cover the gate spacers 221 and a portion of the top surface of the gate electrode layer 206. The metal layer 208 covers the insulating layer 207 on a portion of the top surface of the gate electrode layer 206 and extends to cover the insulating layer 207 on a portion of the top surface of the first well region 101. In some embodiments, the gate electrode layer 206 and the metal layer 208 may electrically connect the gate electrodes G1, G2 through interconnection structures. In some embodiments, while the metal layer 208 which connects the gate electrode layer 206 extends to cover the insulating layer 207 on a portion of the top surface of the first well region 101, the effect of lateral field plate can be produced.

In some embodiments, the material of the gate dielectric layer 205 may include silicon oxide, silicon nitride, silicon oxynitride, high-k dielectric materials, other suitable dielectric materials, or a combination thereof. In some embodiments, the gate dielectric layer 205 may be formed by thermal oxidation, chemical vapor deposition (CVD), or atomic layer deposition (ALD).

The material of the gate electrode layer 206 may include metal silicides, amorphous silicon, polysilicon, one of more kinds of metals, metal nitrides, conductive metal oxides, other suitable conductive materials, or a combination thereof. The conductive material layer may be formed by chemical vapor deposition (CVD), sputtering, resistive thermal evaporation process, electron beam evaporation process, or other suitable deposition processes.

The insulating layer 207 may be made of silicon nitride, silicon oxynitride, silicon carbide, silicon oxide, other suitable materials, or a combination thereof. In some embodiments, the insulating layer 207 may be formed by chemical vapor deposition (CVD), physical vapor deposition (PVD), atomic layer deposition (ALD), high density plasma chemical vapor deposition (HDPCVD), other suitable deposition processes, or a combination thereof.

The metal layer 208 may be formed by a deposition process. The material of the metal layer 208 may include conductive materials, such as aluminium, copper, tungsten, titanium, tantalum, titanium nitride (TiN), tantalum nitride (TaN), nickel silicide (NiSi), cobalt silicide (CoSi), tantulum carbide (TaC), tantulum silicide nitride (TaSiN), tantalum carbide nitride (TaCN), titanium aluminide (TiAl), titanium aluminide nitride (TiAlN), metal oxides, metal alloys, other suitable conductive materials, or a combination thereof.

Next, please refer to FIG. 1 along with FIG. 4. FIG. 4 is a cross-sectional diagram illustrating the semiconductor structure 100 along the line segment A3-A3 in FIG. 1, according to other embodiments of the present disclosure. According to other embodiments of the present disclosure, the semiconductor structure 100 includes the fourth well region 106 disposed on the buried layer 201, wherein the fourth well region 106 is disposed on the outside of the third well region 105 and surrounds the third well region 105 (as shown in FIG. 1). In some embodiments, the fourth well region 106 has the second conductivity type. The fourth well region 106 may be formed by the same doping method and have the same dopant concentration as the first well regions 101. The details are not described again herein to avoid repetition. In some embodiments, a heavily doped region 211 having the same conductivity type as the fourth well region 106 may be formed near the upper surface of the semiconductor substrate 200. The heavily doped region 211 may electrically connect an electrode E1 through an interconnection structure (not shown).

According to other embodiments of the present disclosure, the semiconductor structure 100 includes the fifth well region 107 disposed on an epitaxial layer 413, wherein the fifth well region 107 is disposed on the outside of the fourth well region 106 and surrounds the fourth well region 106 (as shown in FIG. 1). In some embodiments, the epitaxial layer 413 has the first conductivity type. In some embodiments, the fifth well region 107 has the first conductivity type. The fifth well region 107 may be formed by the same doping method and have the same dopant concentration as the second well region 102 and the third well region 105. The details are not described again herein to avoid repetition. In some embodiments, a heavily doped region 212 having the same conductivity type as the fifth well region 107 may be formed near the upper surface of the semiconductor substrate 200. The heavily doped region 212 may electrically connect an electrode E2 through an interconnection structure (not shown).

In FIG. 4, according to other embodiments of the present disclosure, the isolation structures 209 are formed between the third well region 105, the fourth well region 106, and the fifth well region 107, and the isolation structures 209 are formed near the upper surface of the semiconductor substrate 200. The material and formation of the isolation structures 209 illustrated herein are substantially the same as those of the isolation structures 209 illustrated in FIG. 2. The details are not described again herein to avoid repetition.

Figure 5:
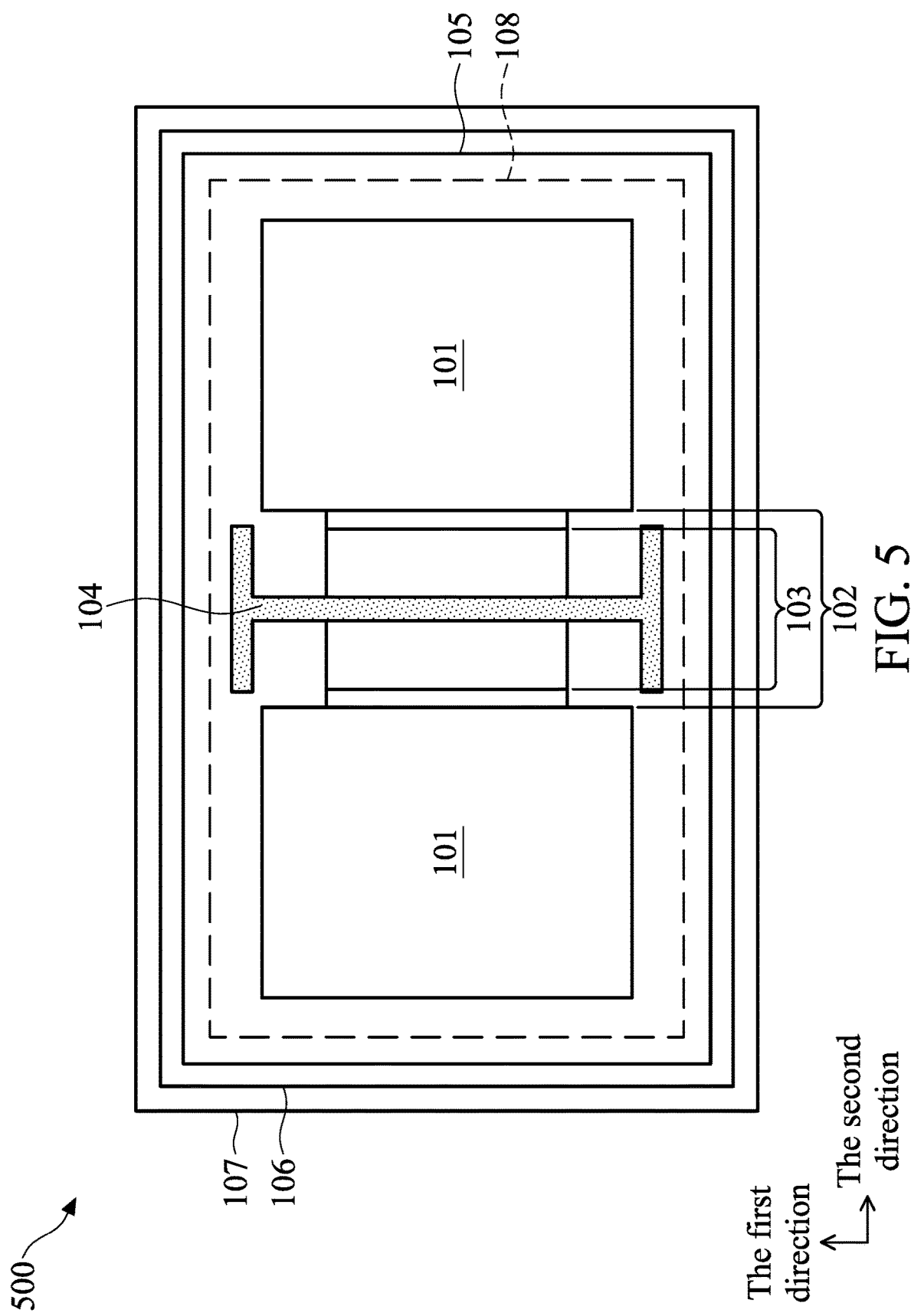
FIG. 5 is a top-view diagram illustrating a portion of an exemplary semiconductor structure, according to some other embodiments of the present disclosure.
Figure 6:
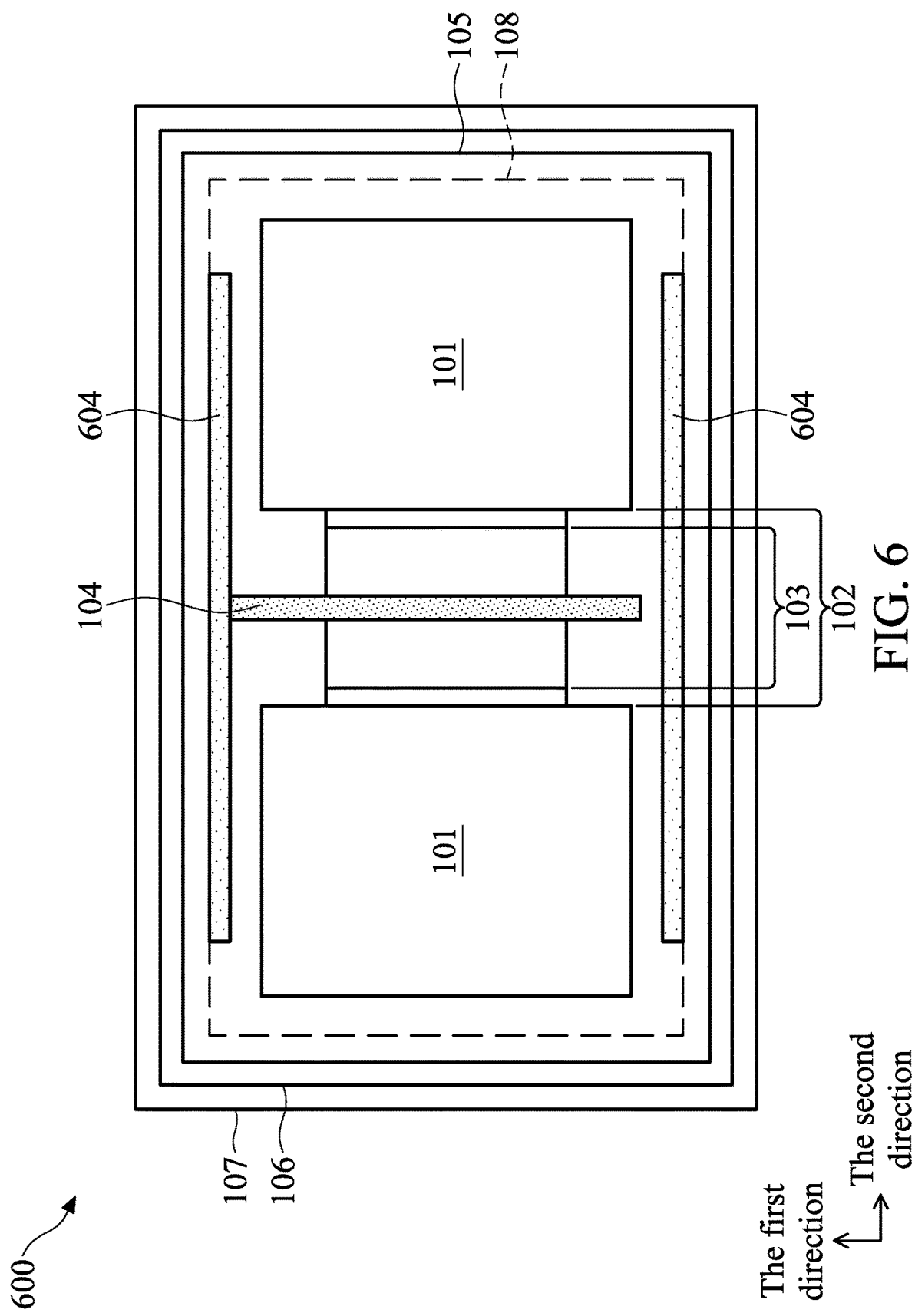
FIG. 6 is a top-view diagram illustrating a portion of an exemplary semiconductor structure, according to some other embodiments of the present disclosure.

FIG. 5 is a top-view diagram illustrating a portion of an exemplary semiconductor structure 500, according to some other embodiments of the present disclosure. The semiconductor structure 500 shown in FIG. 5 is substantially the same as the semiconductor structure 100 shown in FIG. 1, wherein the difference between the semiconductor structure 500 and the semiconductor structure 100 is that an end of the first heavily doped region 104 illustrated in FIG. 5 is T-shaped and an end of the first heavily doped region 104 illustrated in FIG. 1 is I-shaped. FIG. 6 is a top-view diagram illustrating a portion of an exemplary semiconductor structure 600, according to some other embodiments of the present disclosure. The semiconductor structure 600 shown in FIG. 6 is substantially the same as the semiconductor structure 100 shown in FIG. 1, wherein the difference between the semiconductor structure 600 and the semiconductor structure 100 is that the semiconductor structure 600 further includes a pair of additional first heavily doped regions 604 surrounding the pair of first well regions 101. For example, the pair of additional first heavily doped regions 604 may surround the pair of first well region 101 along the boundary of the active region 108 (not shown). The pair of additional first heavily doped regions 604 may or may not connect the first heavily doped region 104 respectively. In some embodiments where the pair of additional first heavily doped regions 604 connect the first heavily doped region 104, although merely the pair of additional first heavily doped regions 604 surrounding the first well regions 101 are illustrated in FIG. 6, a doped region such as the body doped region 103 under the pair of additional first heavily doped regions 604 may also be included. In some embodiments, the pair of additional first heavily doped regions 604 may connect the first heavily doped region 104 through a contact or a metal (not shown). According to some embodiments of the present disclosure, the shapes of the first heavily doped region 104 and/or the pair of additional first heavily doped regions 604 respectively included in the exemplary semiconductor structures 100, 500, and 600 illustrated in FIG. 1 and FIGS. 5-6 may vary depending on the circuit layout, process conditions, and design rules. Furthermore, the shape of the first heavily doped region 104 is not limited to the shape disclosed in the embodiments of the present disclosure.

According to FIGS. 1-6, the semiconductor structures 100, 500, and 600 provided in the embodiments of the present disclosure include the body doped region 103 and the first heavily doped region 104 disposed between the first well regions 101 and extending in the first direction. With the disclosed layout of the doped regions and well regions, the current uniformity in a semiconductor structure can be enhanced, the current leakage between well regions can be reduced, and the on-resistance and the layout area of the active region (e.g. active region 108) can also be reduced.

Figure 7:
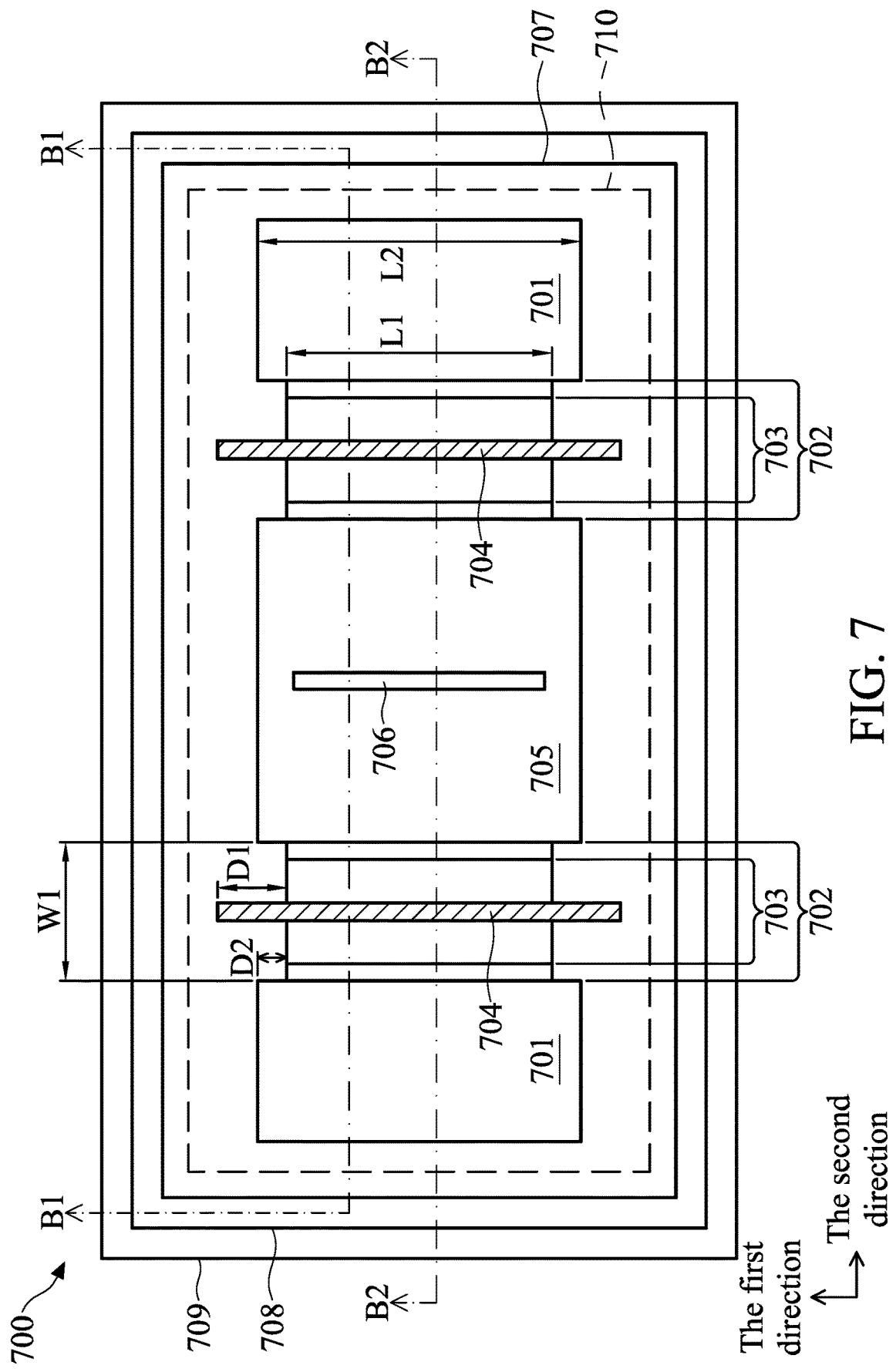
FIG. 7 is a top-view diagram illustrating a portion of an exemplary semiconductor structure, according to some embodiments of the present disclosure.
Figure 8:
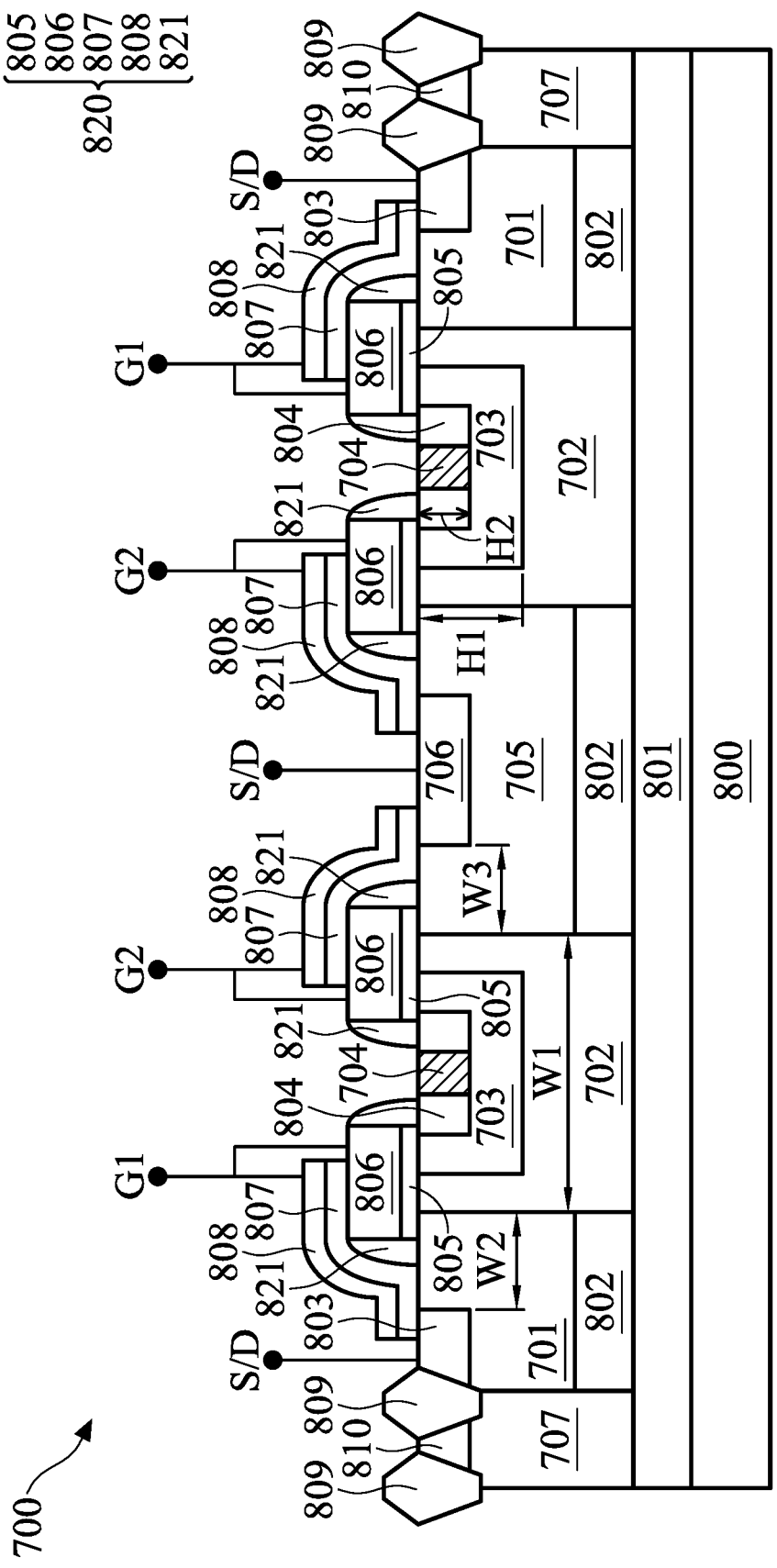
FIG. 8 is a cross-sectional diagram illustrating a semiconductor structure along the line segment B1-B1 in FIG. 7, according to some embodiments of the present disclosure.
Figure 9:
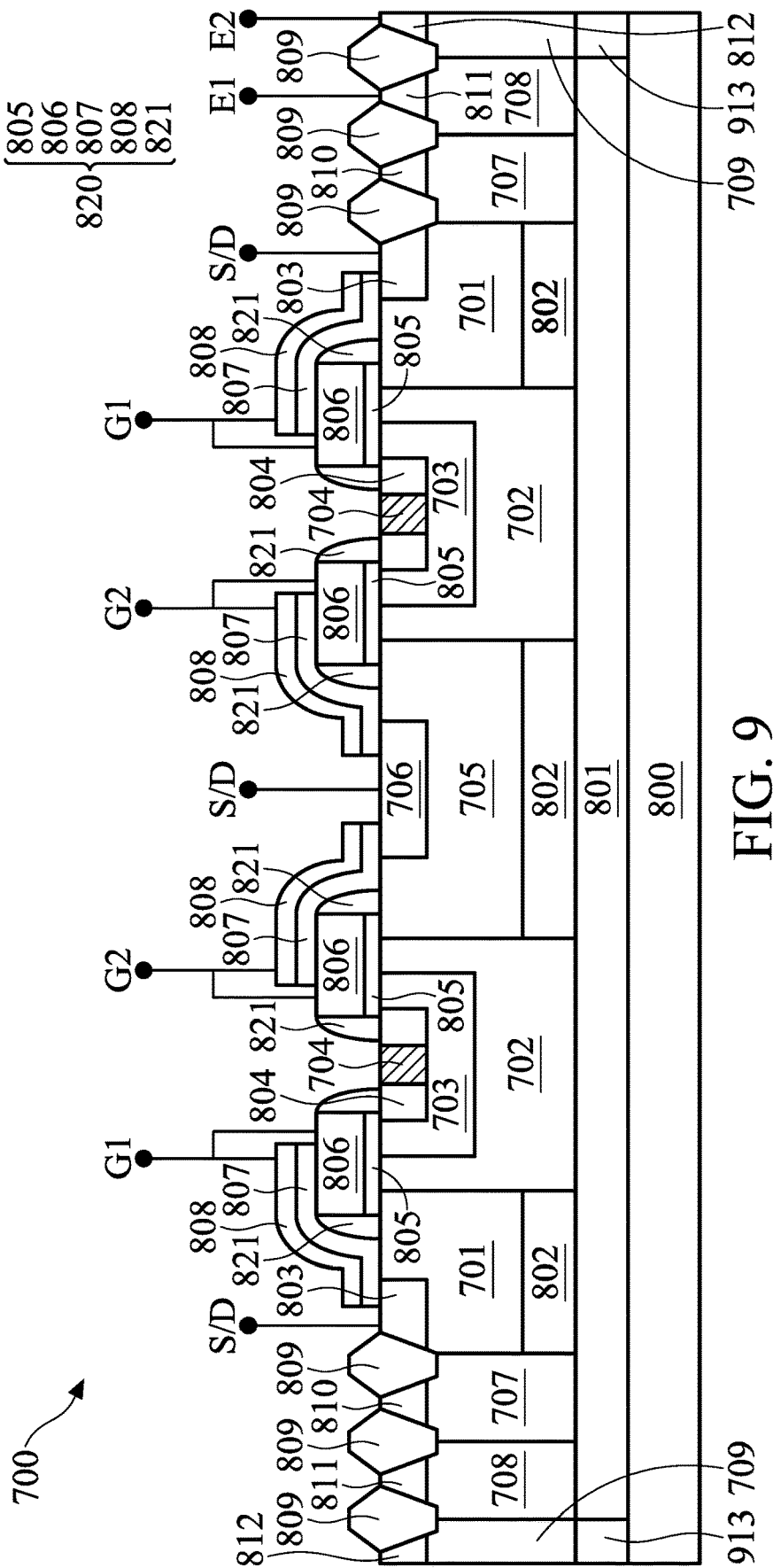
FIG. 9 is a cross-sectional diagram illustrating a semiconductor structure along the line segment B2-B2 in FIG. 7, according to some embodiments of the present disclosure.

Please refer to FIG. 7 along with FIGS. 8-9. FIG. 7 illustrates a semiconductor structure 700 with another layout of the present disclosure. According to some embodiments of the present disclosure, the semiconductor structure 700 shown in FIG. 7 can be interpreted as a pair of semiconductor structures 100 in FIG. 2 connecting back-to-back with each other (e.g. the connection may be "drain-source"-"source-drain" or "source-drain"-"drain-source"). It should be noted that, for the purpose of simplicity and clarity, an active region 710 of the semiconductor structure 700 in FIG. 7 merely includes a pair of active regions 108 of the semiconductor structure 100 illustrated in FIG. 2, but the present disclosure is not limited thereto. In other words, the active region 710 of the semiconductor structure 700 may also include two or more pairs of the active regions 108 of the semiconductor structure 100.

FIG. 7 is a top-view diagram illustrating a portion of an exemplary semiconductor structure 700, according to some embodiments of the present disclosure. FIG. 8 is a cross-sectional diagram illustrating a semiconductor structure along the line segment B1-B1 in FIG. 7. FIG. 9 is a cross-sectional diagram illustrating a semiconductor structure along the line segment B2-B2 in FIG. 7. It should be noted that, for the purpose of simplicity and clarity, FIGS. 7-9 do not illustrate all of the elements of a semiconductor 700, and not all of the elements in the cross-sectional diagrams shown in FIGS. 8-9 are illustrated in FIG. 7.

As shown in FIG. 7, a top-view diagram illustrating a portion of an exemplary semiconductor structure 700, according to some embodiments of the present disclosure. According to some embodiments of the present disclosure, the semiconductor structure 700 includes a pair of first well regions 701, a pair of second well regions 702 disposed between the pair of first well regions 101, and a pair of body doped regions 703 and a pair of first heavily doped regions 704 disposed in the pair of second well regions 702 respectively, a third well region 705 disposed between the pair of second well regions 702, and a second heavily doped region 706 disposed in the third well region 705, wherein the ends of the pair of first heavily doped regions 704 are I-shaped from a top view.

From a top view, according to some embodiments of the present disclosure, the pair of first heavily doped regions 704 and the pair of first well regions 701 both extend in a first direction, wherein the pair of first heavily doped regions 704 extend beyond the opposite edges of the pair of first well regions 701. In some embodiments, the pair of second well regions 102 have a first length L1 extending in the first direction, and the pair of first well regions 701 have a second length L2 extending in the second direction, wherein the first length L1 is shorter than the second length L2. From a top view, according to some embodiments of the present disclosure, the pair of first heavily doped regions 704 extends in the first direction and beyond the first edges of the pair of second well regions 202 with a first distance D1, and the pair of first well regions 701 extend in the first direction and beyond the first edges of the pair of second well regions 702 with a second distance D2, wherein the first distance D1 is longer than the second distance D2. It should be noted that the relations of the values of the first length L1, the second length L2, the first distance D1, and the second distance D2 are substantially the same as those described in FIG. 1. The details are not described again herein to avoid repetition.

According to some embodiments of the present disclosure, the semiconductor structure 700 includes the body doped regions 703 and the first heavily doped regions 704 disposed between the pair of first well regions 701 extending along a specific direction. With the protective structure formed of the layout of the body doped regions 703 and the first heavily doped regions 704, the current leakage between the pair of first well regions 701 can be reduced or prevented. In some embodiments, the disclosed layout of the body doped regions 703 and the first heavily doped regions 704 can be used to prevent from current leakage while the distance between the pair of first well regions 701 (e.g. the width W1 in FIG. 7) is less than 2 um. It should be noted that in order to succinctly describe the embodiments of the present disclosure and highlight the technical features thereof, not all of the elements of the semiconductor structure 700 are illustrated in FIG. 7.

As shown in FIG. 7, according to some embodiments of the present disclosure, in the semiconductor structure 700, the pair of first well regions 701 are surrounded by a fourth well region 707, the fourth well region 707 is surrounded by a fifth well region 708, and the fifth well region 708 is surrounded by a sixth well region 709. In some embodiments, the pair of first well regions 701, the third well region 705, and the fifth well region 708 have the second conductivity type, and the second well region 702, the fourth well region 707, and the sixth well region 709 have the first conductivity type, which is the opposite of the second conductivity type. In some embodiments, the first conductivity type is p-type, and the second conductivity type is n-type, but the present disclosure is not limited thereto.

As shown in FIG. 8 and referring to the top-view diagram shown in FIG. 7, according to some embodiments of the present disclosure, the semiconductor structure 700 mainly includes a semiconductor substrate 800 having the first conductivity type, a buried layer 801 disposed on the semiconductor substrate 800 having the second conductivity type, a pair of first well regions 701 disposed on the buried layer 801, a pair of second well regions 702 disposed on the buried layer 801 and between the pair of first well regions 701, a pair of body doped regions 703 disposed in the pair of second well regions 702 respectively, a pair of first heavily doped regions 704 disposed in the pair of body doped regions 703 respectively, and a third well region 705 disposed on the buried layer 801 and between the pair of second well regions 702. In some embodiments, the pair of first well regions 701 and the third well region 705 have the second conductivity type which is the same as the conductivity type of the buried layer 801, and the pair of second well regions 702, the pair of body doped regions 703, and the pair of first heavily doped regions 704 have the first conductivity type which are the same as the conductivity type of the semiconductor substrate 800. In some embodiments, the first conductivity type is p-type, and the second conductivity type that is the opposite of the first conductivity type is n-type. In some embodiments, the pair of second well regions 702 have a first dopant concentration, the pair of body doped regions 703 have a second dopant concentration, and the pair of first heavily doped regions 704 have a third dopant concentration, wherein the third dopant concentration is greater than the second dopant concentration, and the second dopant concentration is greater than the first dopant concentration.

As shown in FIG. 8, in some embodiments, the semiconductor substrate 800 may be a silicon substrate, but the present disclosure is not limited thereto. For example, the material, the conductivity type, and the dopant concentration of the semiconductor substrate 800 are substantially the same as those of the semiconductor substrate 200 illustrated in FIG. 2. The details are not described again herein to avoid repetition.

As shown in FIG. 8, in some embodiments, the semiconductor structure 700 includes the buried layer 801 disposed on the semiconductor substrate 800. In some embodiments, the material, thickness, the conductivity type, and the dopant concentration of the buried layer 801 are substantially the same as those of the buried layer 201 illustrated in FIG. 2. The details are not described again herein to avoid repetition.

As shown in FIG. 8, according to some embodiments of the present disclosure, the semiconductor structure 700 includes the pair of first well regions 701 disposed on the buried layer 801. In some embodiments, the material, the conductivity type, and the dopant concentration of the pair of first well regions 701 are substantially the same as those of the first well regions 101. The details are not described again herein to avoid repetition. In some embodiments, the pair of first well regions 701 may contact the buried layer 801 directly. In other embodiments, a first conductivity type region 802 is disposed between the pair of first well regions 701 and the buried layer 801. The first conductivity type region 802 may be formed by the same doping method and have the same dopant concentration as the semiconductor substrate 800. The details are not described again herein to avoid repetition.

As shown in FIG. 8, in some embodiments, the semiconductor structure 700 includes the pair of second well regions 702 disposed on the buried layer 801 and between the pair of first well regions 701. In some embodiments, the material, the conductivity type, and the dopant concentration of the pair of second well regions 702 are substantially the same as those of the second well region 102 illustrated in FIG. 2. The details are not described again herein to avoid repetition. From a top view, as shown in FIG. 7, in some embodiments, the width W1 of the pair of second well regions 702 extending in the second direction is less than or equal to 2 um, such as 2 um or 1 um.

As shown in FIG. 8, according to some embodiments of the present disclosure, the semiconductor structure 700 includes the fourth well region 707 disposed on the buried layer 801, wherein the fourth well region 707 is disposed on the outside of the pair of first well regions 701 and surrounds the pair of first well regions 701 (as shown in FIG. 7). In some embodiments, the fourth well region 707 has the first conductivity type and the doping method and dopant concentration of which are the same as those of the pair of second well regions 702. The details are not described again herein to avoid repetition. In some embodiments, a heavily doped region 810 having the same conductivity type as the fourth well region 707 may be formed near the upper surface of the semiconductor substrate 800. The heavily doped region 810 may electrically connect an electrode (not shown) through an interconnection structure (not shown).

In FIG. 8, according to some embodiments of the present disclosure, isolation structures 809 are formed between the first well region 701 and the fourth well region 707, and the isolation structures 809 are formed near the upper surface of the semiconductor substrate 800. In some embodiments, the isolation structures 809 may be made of silicon oxide, and the isolation structures 809 may be local oxidation of silicon (LOCOS) isolation structures 809 made by thermal oxidation process. In other embodiments, the isolation structures 809 may be shallow trench isolation (STI) structures made by an etching and deposition process.

As shown in FIG. 8, according to some embodiments of the present disclosure, the semiconductor structure 700 includes the pair of body doped regions 703 disposed in the pair of second well regions 702 respectively. In some embodiments, the material, the conductivity type, and the dopant concentration of the pair of body doped regions 703 are substantially the same as those of the body doped region 103 illustrated in FIG. 2. The details are not described again herein to avoid repetition. In some embodiments, the depth H1 of the pair of body doped regions 703 is in a range from about 0.5 um to about 1 um. In some embodiments, the pair of body doped regions 703 may be formed by an ion implantation process or a diffusion process.

As shown in FIG. 8, according to some embodiments of the present disclosure, the semiconductor structure 700 includes the pair of first heavily doped regions 704 disposed in the pair of body doped regions 703 respectively. In some embodiments, the material, the conductivity type, and the dopant concentration of the pair of first heavily doped regions 704 are substantially the same as those of the first heavily doped region 104 illustrated in FIG. 2. The details are not described again herein to avoid repetition. In some embodiments, the depth H2 of the pair of first heavily doped regions 704 is less than about 0.5 um, such as 0.2 um. In some embodiments, the pair of first heavily doped regions 704 may be formed by an ion implantation process or a diffusion process.

To describe the layout of the pair of body doped regions 703 and the pair of first heavily doped regions 704 more clearly, please refer to FIG. 7 along with FIG. 3. In FIG. 7, according to some embodiments of the present disclosure, although merely a portion of the first heavily doped region 704 extending in the first direction and beyond the second well region 702 is illustrated in FIG. 7, the portion extending beyond the second well region 702 includes both the first heavily doped region 704 and the body doped region 703 under the first heavily doped region 704 (i.e. as shown in FIG. 3). The layout of the pair of body doped regions 703 and the pair of first heavily doped regions 704 provided in the embodiment of the present disclosure can serve as a protective structure to reduce the current leakage between the well regions effectively in cases where the distance between the pair of first well regions 701 is small (e.g. less than 2 um).

As shown in FIG. 8, according to some embodiments of the present disclosure, the semiconductor structure 700 includes the third well region 705 disposed on the buried layer 801 and between the pair of second well regions 702. In some embodiments, the third well region 705 has the second conductivity type. The third well region 705 may be formed by the same doping method and have the same dopant concentration as those of the pair of first well regions 701. The details are not described again herein to avoid repetition. In some embodiments, a second heavily doped region 706 having the same conductivity type as the third well region 705 may be formed near the upper surface of the semiconductor substrate 800. In some embodiments, the second heavily doped region 706 may electrically connect a source/drain electrode S/D through an interconnection structure (not shown).

As shown in FIG. 8, according to some embodiments of the present disclosure, the semiconductor structure 700 further includes source/drain regions 803 disposed in the pair of first well regions 701 respectively, wherein the source/drain regions 803 are disposed near the upper surface of the semiconductor substrate 800. In some embodiments, the source/drain regions 803 have the second conductivity type, such as n-type. The source/drain regions 803 may electrically connect source/drain electrodes S/D through interconnection structure (not shown).

In some embodiments, the distance between the source region (drain region) 803 and the interface of the first well region 701 and the second well region 702 is a first drifting distance W2, and the distance between the second heavily doped region 706 and the interface of the third well region 705 and the second well region 702 is a second drifting distance W3. The first drifting distance W2 and the second drifting distance W3 are not greater than 2 um (i.e. less than or equal to 2 um). In some embodiments, the first drifting distance W2 is different from the second drifting distance W3. In such cases, the first well region 101 and the third well region 705 have different drifting distances respectively (i.e. the first well region 101 and the third well region 705 have different areas respectively). Thus, the first well region 101 and the third well region 705 can bear different voltages. For example, the maximal voltage that the first well regions 101 with a shorter drifting distance can bear is less than the maximal voltage that the third well region 705 with a longer drifting distance can bear. In other words, the third well region 705 with a longer drifting distance can bear a greater voltage than the first well regions 101 with a shorter drifting distance. In some embodiment of the present disclosure, according to the applied voltages, the area of the active region (e.g. an active region 710) of the semiconductor structure 700 can be reduced by adjusting the respective drifting distances of the first well region 101 and the third well region 705.

As shown in FIG. 8, according to some embodiments of the present disclosure, the pair of second well regions 702 included in the semiconductor structure 700 further include a pair of third heavily doped regions 804 respectively, wherein one of the first heavily doped regions 704 is disposed between the pair of third heavily doped regions 804. In some embodiments, the pair of third heavily doped regions 804 have the second conductivity type, such as n-type, and the dopant of which may be such as P, As, N, Sb ions, or a combination thereof. In some embodiments, the pair of third heavily doped regions 804 may be formed by an ion implantation process or a diffusion process. In some embodiments, the first heavily doped region 704 connects the pair of third heavily doped regions 804 through a surface conductor, and the first heavily doped region 704 and the pair of third heavily doped regions 804 can float. In such cases, the current can flow through the surface conductor without through an additional interconnection structure, so the goal of reducing the on-resistance and enhancing the current uniformity can be achieved. In other embodiments, the first heavily doped region 704 and pair of third heavily doped regions 804 may electrically connect electrodes (not shown) through an interconnection structure (not shown).

As shown in FIG. 8, according to some embodiments of the present disclosure, the semiconductor structure 700 further includes pairs of gate structures 820 disposed on the first well region 701 and the second well region 702 and disposed on the second well region 702 and the third well region 705, wherein the pairs of gate structures 820 partially cover the pair of third heavily doped region 804. In some embodiments, each of the gate structures 820 includes a gate dielectric layer 805, a gate electrode layer 806 disposed on the gate dielectric layer 805, an insulating layer 807, a metal layer 808, and gate spacers 821. The gate spacers 821 are disposed on the opposite sides of the stack of the gate dielectric layer 805 and the gate electrode layer 806. The insulating layer 807 partially covers the first well region 701 and extends to cover the gate spacers 821 and a portion of the top surface of the gate electrode layer 806. The metal layer 808 covers the insulating layer 807 on a portion of the top surface of the gate electrode layer 806 and extends to cover the insulating layer 807 on a portion of the top surface of the first well region 701. In some embodiments, the gate electrode layer 806 and the metal layer 808 electrically connect the gate electrodes G1, G2 through an interconnection structure. In some embodiments, while the metal layer 808 which connects the gate electrode layer 806 extends to cover the insulating layer 807 on a portion of the top surface of the first well region 701, the effect of lateral field plate can be produced. In some embodiments, the material and formation of the gate structures 820 are substantially the same as those of the gate structures 220 illustrated in FIG. 2. The details are not described again herein to avoid repetition.

Next, please refer to FIG. 7 along with FIG. 9. FIG. 9 is a cross-sectional diagram illustrating a semiconductor structure 700 along the line segment B2-B2 in FIG. 7, according to some embodiments of the present disclosure. According to other embodiments of the present disclosure, the semiconductor structure 700 includes the fifth well region 708 disposed on the buried layer 801, wherein the fifth well region 708 is disposed on the outside of the fourth well region 707 and surrounds the fourth well region 707 (as shown in FIG. 7). In some embodiments, the fifth well region 708 has the second conductivity type. The fifth well region 708 may be formed by the same doping method and have the same dopant concentration as those of the first well region 701 and the third well region 705. The details are not described again herein to avoid repetition. In some embodiments, a heavily doped region 811 having the same conductivity type as the fifth well regions 708 may be formed near the upper surface of the semiconductor substrate 800. The heavily doped region 811 may electrically connect an electrode E1 through an interconnection structure (not shown).

According to other embodiments of the present disclosure, the semiconductor structure 700 includes the sixth well region 709 disposed on an epitaxial layer 913, wherein the sixth well region 709 is disposed on the outside of the fifth well region 708 and surrounds the fifth well region 708 (as shown in FIG. 7). In some embodiments, the epitaxial layer 913 has the first conductivity type. In some embodiments, the sixth well region 709 has the first conductivity type. The sixth well region 709 may be formed by the same doping method and have the same dopant concentration as those of the second well region 702 and the fourth well region 707. The details are not described again herein to avoid repetition. In some embodiments, a heavily doped region 812 having the same conductivity type as the sixth well region 709 may be formed near the upper surface of the semiconductor substrate 800. The heavily doped region 812 may electrically connect an electrode E2 through an interconnection structure (not shown).

In FIG. 9, according to other embodiments of the present disclosure, the isolation structures 809 are formed between the fourth well region 707, the fifth well region 708, and the sixth well region 709, and the isolation structures 809 are formed near the upper surface of the semiconductor substrate 800. The material and formation of the isolation structures 809 illustrated herein are substantially the same as those of the isolation structures 209 illustrated in FIG. 2. The details are not described again herein to avoid repetition.

Figure 10:
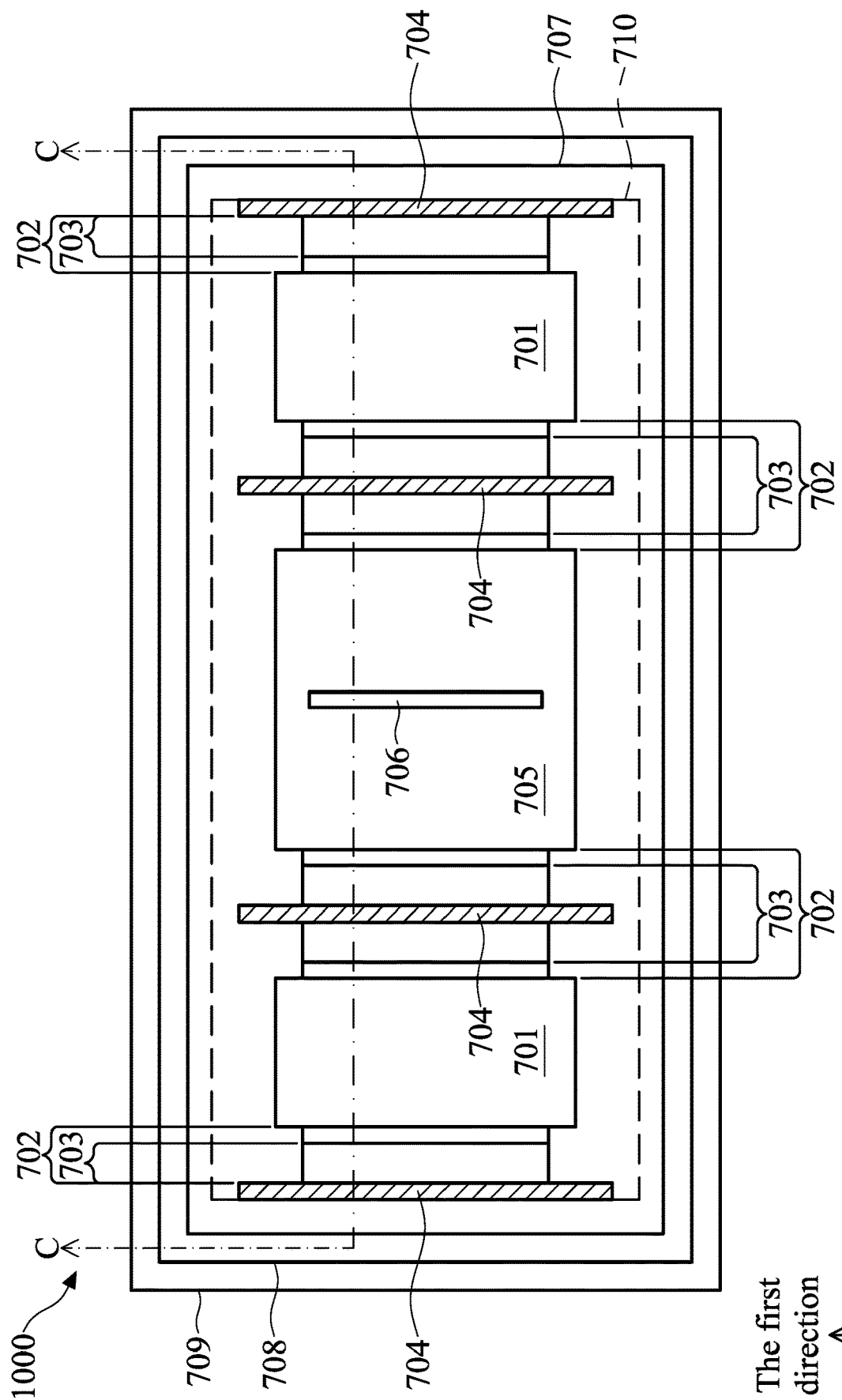
FIG. 10 is a top-view diagram illustrating a portion of an exemplary semiconductor structure, according to some embodiments of the present disclosure.
Figure 11:
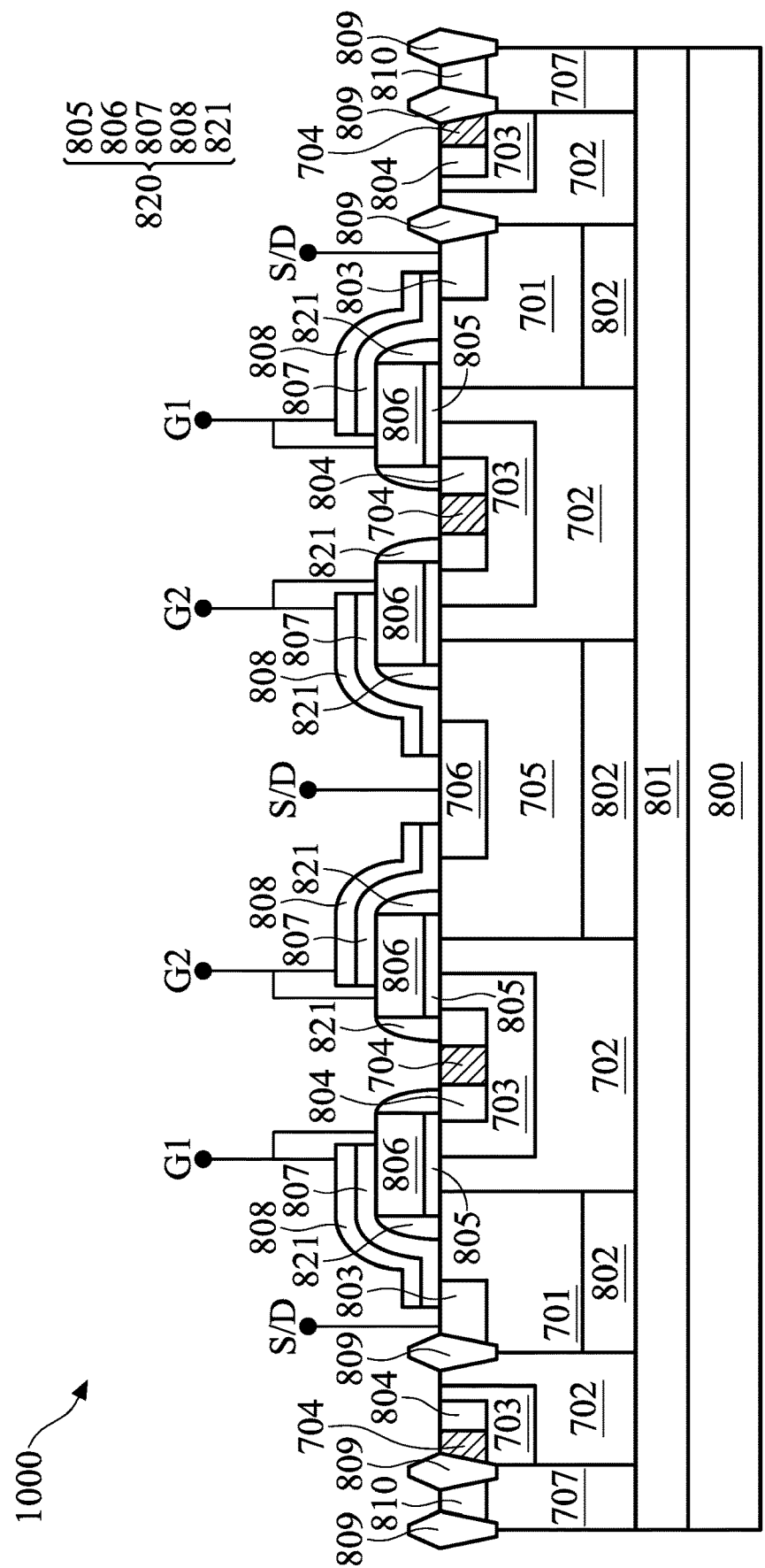
FIG. 11 is a cross-sectional diagram illustrating a semiconductor structure along the line segment C-C in FIG. 10, according to some embodiments of the present disclosure.

FIG. 10 is a top-view diagram illustrating a portion of an exemplary semiconductor structure 1000 in accordance with some embodiments of the present disclosure, and FIG. 11 is a cross-sectional diagram illustrating a semiconductor structure along the line segment C-C in FIG. 10. It should be noted that in order to succinctly describe the embodiments of the present disclosure and highlight the technical features thereof, not all of the elements of the semiconductor structure 1000 are illustrated in FIGS. 10-11, and not all of the elements in the cross-sectional diagram shown in FIG. 11 are illustrated in FIG. 10.

According to some embodiments of the present disclosure, the difference between the semiconductor structure 1000 illustrated in FIG. 10 and the semiconductor structure 700 illustrated in FIG. 7 is that the semiconductor structure 1000 further includes a pair of additional second well regions 702 disposed on the outside of the pair of first well regions 701 and a pair of body doped regions 703 and a pair of first heavily doped regions 704 disposed in the pair of additional second well regions 702.

As shown in FIG. 11 along with the top-view diagram illustrated in FIG. 10, according to some embodiments of the present disclosure, the difference between the cross-sectional diagram of the semiconductor structure 1000 illustrated in FIG. 11 and the cross-sectional diagram of the semiconductor structure 700 illustrated in FIG. 8 is that the semiconductor structure 1000 further includes a pair of additional second well regions 702 disposed on the buried layer 801 and between the pair of first well regions 701 and the pair of fourth well regions 707, a pair of body doped regions 703 disposed in the pair of additional second well regions 702 respectively, and a pair of first heavily doped regions 704 and third heavily doped regions 804 disposed in the pair of body doped regions 703 respectively. In some embodiments, the material and formation of the pair of additional second well regions 702, the body doped regions 703, the first heavily doped regions 704, and the third heavily doped region 804 are substantially the same as those illustrated in FIG. 8. The details are not described again herein to avoid repetition.

Figure 12:
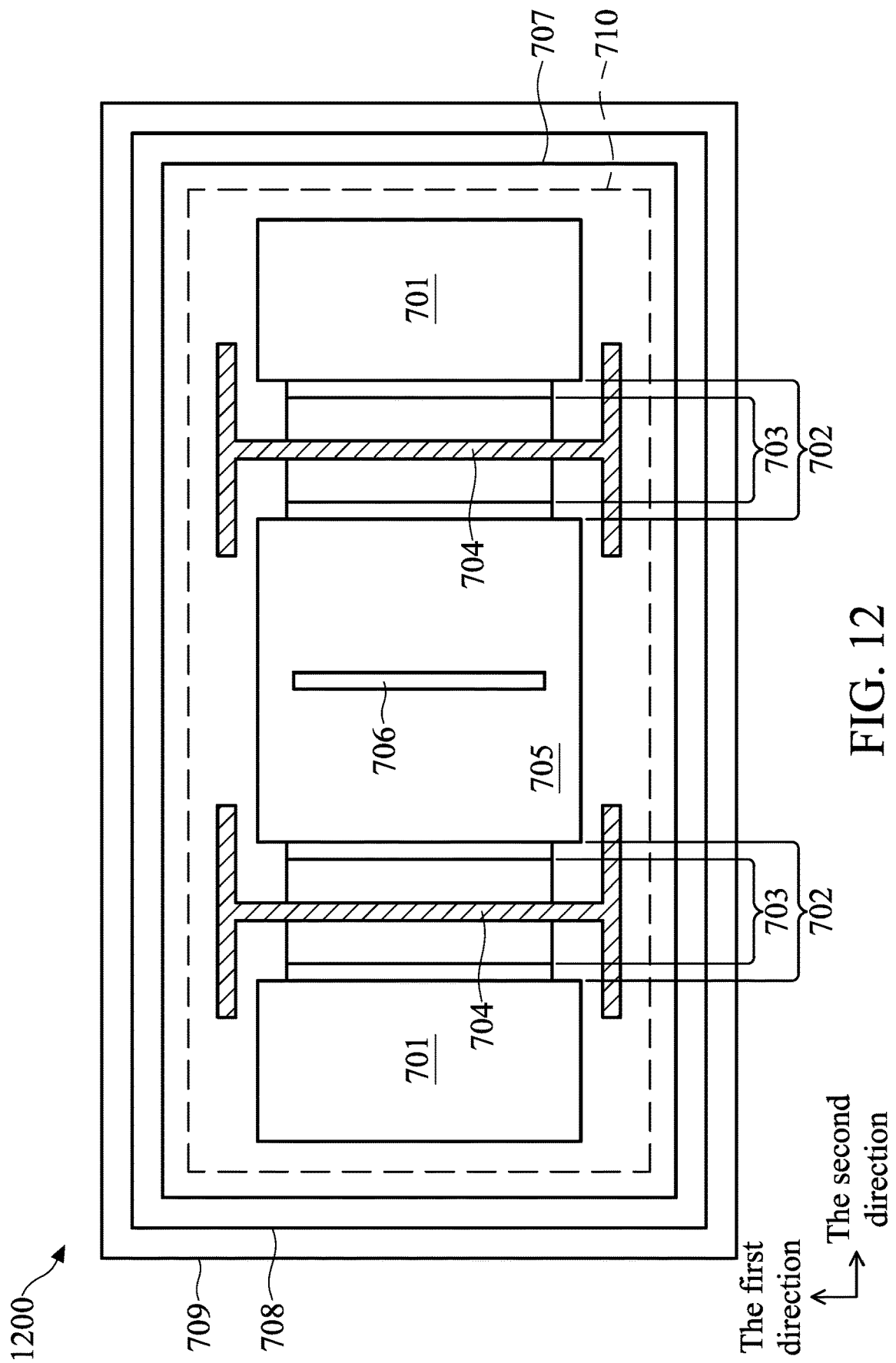
FIG. 12 is a top-view diagram illustrating a portion of an exemplary semiconductor structure, according to other embodiments of the present disclosure.
Figure 13:
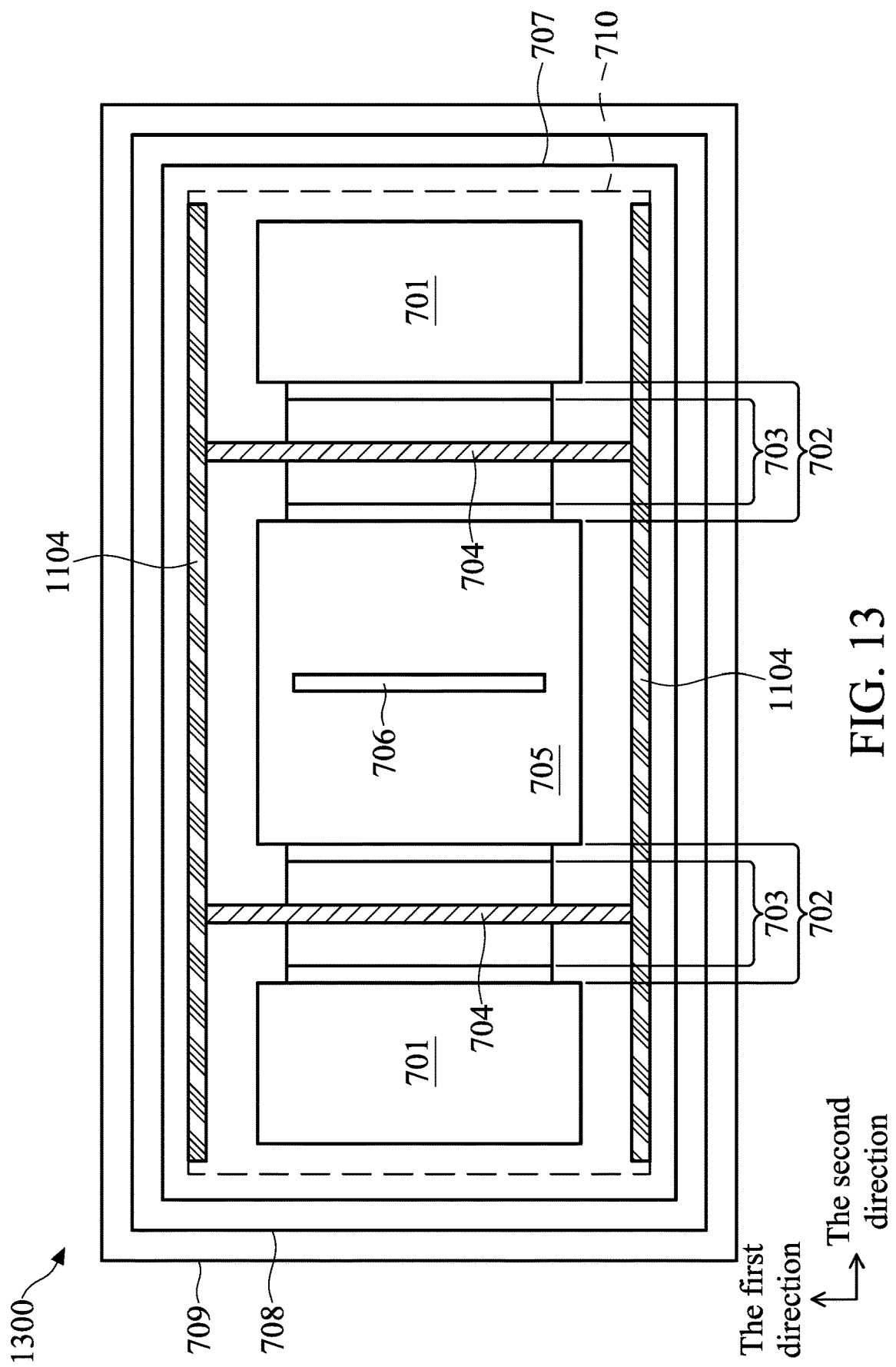
FIG. 13 is a top-view diagram illustrating a portion of an exemplary semiconductor structure, according to other embodiments of the present disclosure.
Figure 14:
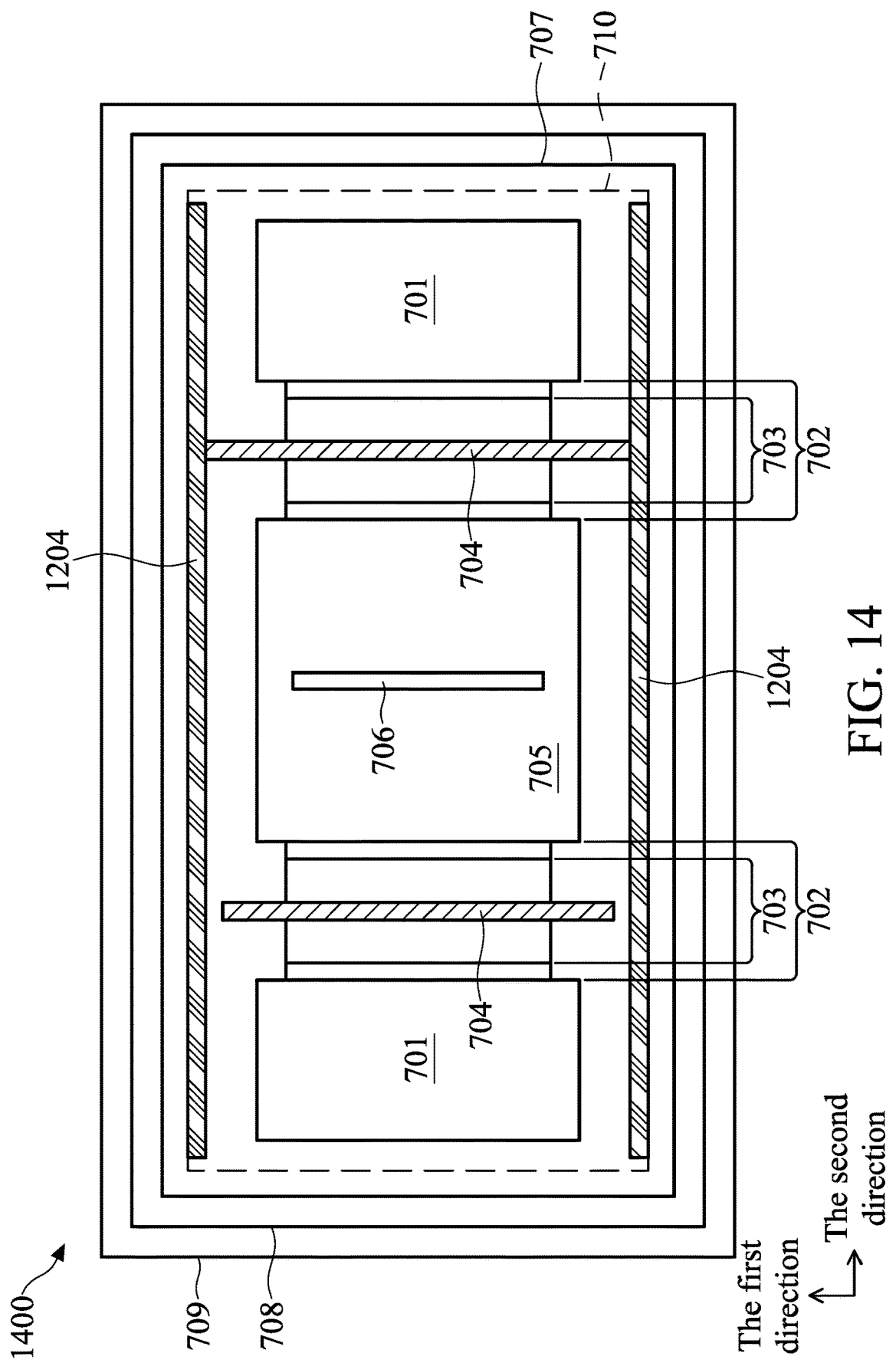
FIG. 14 is a top-view diagram illustrating a portion of an exemplary semiconductor structure, according to other embodiments of the present disclosure.

FIG. 12 is a top-view diagram illustrating a portion of an exemplary semiconductor structure 1200, according to other embodiments of the present disclosure. The semiconductor structure 1200 shown in FIG. 12 is substantially the same as the semiconductor structure 700 shown in FIG. 7, wherein the difference between the semiconductor structure 1200 and the semiconductor structure 700 is that an end of the first heavily doped region 704 illustrated in FIG. 12 is T-shaped and an end of the first heavily doped region 704 illustrated in FIG. 7 is I-shaped. The semiconductor structures 1300, 1400 shown in FIGS. 13-14 are substantially the same as the semiconductor structure 700 shown in FIG. 7, wherein the difference between the semiconductor structures 1300, 1400 and the semiconductor structure 700 is that the semiconductor structures 1300, 1400 further include at least a pair of additional first heavily doped regions 1104, 1204 surrounding the pair of first well regions 701. As shown in FIG. 13, in some embodiments, the pair of additional first heavily doped regions 1104 may connect the first heavily doped region 704 through a contact or a metal (not shown). As shown in FIG. 14, the pair of additional first heavily doped regions 1204 may or may not connect the first heavily doped region 704. In some embodiments where the pair of additional first heavily doped regions 1104, 1204 connect the first heavily doped region 704 respectively, although merely the pair of additional first heavily doped regions 1104, 1204 surrounding the first well regions 701 are illustrated in FIGS. 13-14, a body doped region, such as the body doped region 703, under the pair of additional first heavily doped regions 1104, 1204 is also included. According to some embodiments of the present disclosure, the shapes of the first heavily doped region 704 and/or the pair of additional first heavily doped regions 1104, 1204 respectively included in the exemplary semiconductor structures 700, 1200, 1300, and 1400 illustrated in FIG. 7 and FIGS. 12-14 may vary depending on the circuit layout, process conditions, and design rules. Furthermore, the shape of the first heavily doped region 704 is not limited to the shape disclosed in the embodiments of the present disclosure.

According to FIGS. 7-14, the semiconductor structures 700, 1000, 1200, 1300, and 1400 provided in the embodiments of the present disclosure include the pair of body doped regions 703 and the pair of first heavily doped regions 704 disposed between the first well regions 701 and extending in the first direction. With the disclosed layout of the doped regions and well regions, the current uniformity in a semiconductor structure can be enhanced, the current leakage between well regions can be reduced, and the on-resistance and the layout area of the active region (e.g. active region 710) can also be reduced.

The semiconductor structures provided in the embodiments of the present disclosure may function as bidirectional current semiconductor structures which include one or more back-to-back connecting floating body dual gate (FBDG) MOSFETs. The semiconductor structures provided in the embodiments of the present disclosure may be applied to battery disconnect switches (e.g. lithium ion battery disconnect switches). In some embodiments, the number of the back-to-back connecting FBDG MOSFETs included in the semiconductor structure may vary depending on the need of driving capability of the battery disconnect switch. According to the embodiments of the present disclosure, the semiconductor structure includes a pair of body doped regions and a pair of first heavily doped regions disposed between a plurality of first well regions and extending along a specific direction. With the disclosed layout of the doped regions and well regions, the current uniformity in the semiconductor structure can be enhanced, the current leakage between well regions can be reduced, and the on-resistance and the layout area of the active region can also be reduced.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a semiconductor substrate having a first conductivity type;
a buried layer disposed on the semiconductor substrate, having a second conductivity type that is opposite of the first conductivity type;
a pair of first well regions disposed on the buried layer, having the second conductivity type;
a second well region disposed on the buried layer and between the pair of first well regions, having the first conductivity type and a first dopant concentration;

a body doped region disposed in the second well region, having the first conductivity type and a second dopant concentration;

a first heavily doped region disposed in the body doped region, having the first conductivity type and a third dopant concentration, wherein the third dopant concentration is greater than the second dopant concentration, and the second dopant concentration is greater than the first dopant concentration; and from a top view, the first heavily doped region and the pair of first well regions extend in a first direction, and the first heavily doped region extends beyond opposite edges of the pair of first well regions.

2. The semiconductor structure as claimed in claim 1, wherein the second well region has a first length extending in the first direction and the pair of the first well regions have a second length extending in the second direction from a top view, wherein the first length is shorter than the second length.

3. The semiconductor structure as claimed in claim 1, wherein the first heavily doped region extends in the first direction and beyond a first edge of the second well region with a first distance, and the pair of first well regions extend in the first direction and beyond the first edge of the second well region with a second distance from a top view, wherein the first distance is longer than the second distance.

4. The semiconductor structure as claimed in claim 1, wherein a depth of the first heavily doped region is less than about 0.5 um, and a depth of the body doped region is in a range from about 0.5 um to about 1 um.

5. The semiconductor structure as claimed in claim 1, wherein a width of the second well region extending in the second direction is less than or equal to 2 um.

6. The semiconductor structure as claimed in claim 1, further comprising source/drain regions having the second conductivity type, wherein the source/drain regions are respectively disposed in the pair of first well regions.

7. The semiconductor structure as claimed in claim 6, wherein a first drifting distance is defined as a distance between the source region and an interface of one of the pair of first well regions and the second well region, and a second drifting distance is defined as a distance between the drain region and an interface of another one of the pair of first well regions and the second well region, and both the first drifting distance and the second drifting distance are less than or equal to 2 um.

8. The semiconductor structure as claimed in claim 7, wherein the first drifting distance is different from the second drifting distance, and the pair of first well regions is asymmetric with respect to the first heavily doped region.

9. The semiconductor structure as claimed in claim 1, wherein the pair of first well regions is symmetric with respect to the first heavily doped region.

10. The semiconductor structure as claimed in claim 1, wherein the second well region further comprises a pair of second heavily doped regions having the second conductivity type, wherein the first heavily doped region is disposed between the pair of second heavily doped regions.

11. The semiconductor structure as claimed in claim 10, further comprising a pair of gate structures disposed on the pair of first well regions and the second well region, wherein the pair of gate structures partially cover the pair of second heavily doped regions.

12. The semiconductor structure as claimed in claim 1, further comprising a pair of third well regions disposed on the buried layer, having the first conductivity type, wherein the pair of first well regions are disposed between the pair of third well regions.

13. The semiconductor structure as claimed in claim 1, wherein an end of the first heavily doped region is I-shaped or T-shaped from a top view.

14. The semiconductor structure as claimed in claim 1, further comprising at least a pair of additional first heavily doped regions surrounding the pair of first well regions from a top view.

15. A semiconductor structure, comprising:
a semiconductor substrate having a first conductivity type;
a buried layer disposed on the semiconductor substrate, having a second conductivity type that is the opposite of the first conductivity type;
a pair of first well regions disposed on the buried layer, having the second conductivity type;
a pair of second well regions disposed on the buried layer and between the pair of first well regions, having the first conductivity type and a first dopant concentration;
a pair of body doped regions respectively disposed in the pair of second well regions, having the first conductivity type and a second dopant concentration;
a pair of first heavily doped regions respectively disposed in the pair of body doped regions, having the first conductivity type and a third dopant concentration, wherein the third dopant concentration is greater than the second dopant concentration, and the second dopant concentration is greater than the first dopant concentration;
a third well region disposed on the buried layer and between the pair of second well regions, having the second conductivity type; and
from a top view, the pair of first heavily doped regions and the pair of first well regions extend in a first direction, and the pair of first heavily doped regions extends beyond opposite edges of the pair of first well regions.

16. The semiconductor structure as claimed in claim 15, wherein the pair of second well regions have a first length extending in the first direction and the pair of first well regions have a second length extending in the second direction from a top view, wherein the first length is shorter than the second length.

17. The semiconductor structure as claimed in claim 15, wherein the pair of first heavily doped regions extends in the first direction and beyond first edges of the pair of second well regions with a first distance, and the pair of first well regions extend in the first direction and beyond the first edges of the pair of second well regions with a second distance from a top view, wherein the first distance is longer than the second distance.

18. The semiconductor structure as claimed in claim 15, wherein a depth of the pair of first heavily doped regions is less than about 0.5 um, a depth of the pair of body doped regions is in a range from about 0.5 um to about 1 um, and a width of the pair of second well regions in the second direction is less than or equal to 2 um.

19. The semiconductor structure as claimed in claim 15, further comprising a pair of second heavily doped regions disposed in the third well region, having the second conductivity type.

20. The semiconductor structure as claimed in claim 19, further comprising source/drain regions having the second conductivity type, wherein the source/drain regions are respectively disposed in the pair of first well regions.

21. The semiconductor structure as claimed in claim 20, wherein a first drifting distance is defined as the distance between one of the source/drain regions and an interface of one of the pair of first well regions and one of the pair of second well regions, and a second drifting distance is defined as the distance between one of the pair of second heavily doped regions and an interface of one of the pair of second well regions and the third well region, and both the first drifting distance and the second drifting distance are less than or equal to 2 um.

22. The semiconductor structure as claimed in claim 15, wherein each of the pair of second well regions further comprises a pair of third heavily doped regions, having the second conductivity type, wherein one of the pair of first heavily doped regions is disposed between the pair of third heavily doped regions.

23. The semiconductor structure as claimed in claim 22, further comprising pairs of gate structures disposed on the pair of first well regions and the pair of second well regions and disposed on the pair of second well regions and the third well region, wherein the pairs of gate structures partially cover the pair of third heavily doped regions.

24. The semiconductor structure as claimed in claim 15, further comprising at least a pair of additional first heavily doped regions surrounding the pair of first well regions and connecting the pair of first heavily doped regions from a top view.

* * * * *